United States Patent
Savarese et al.

(10) Patent No.: US 9,592,424 B2
(45) Date of Patent: Mar. 14, 2017

(54) APPARATUSES AND METHODS RELATING TO FINDABLE BALLS

(71) Applicant: TopGolf International, Inc., Dallas, TX (US)

(72) Inventors: Chris Savarese, Danville, CA (US); Noel H. C. Marshall, Gerringong (AU); Forrest F. Fulton, Los Altos Hills, CA (US); Mark A. Shea, Los Gatos, CA (US); Lauro C. Cadorniga, Piedmont, SC (US); Susan McGill, Redwood City, CA (US); Gerald Latus, Los Gatos, CA (US)

(73) Assignee: Topgolf International, Inc., Dallas, TX (US)

( * ) Notice: Subject to any disclaimer, the term of this patent is extended or adjusted under 35 U.S.C. 154(b) by 46 days.

(21) Appl. No.: 14/285,405

(22) Filed: May 22, 2014

(65) Prior Publication Data
US 2015/0020377 A1    Jan. 22, 2015

Related U.S. Application Data

(60) Continuation of application No. 12/552,162, filed on Sep. 1, 2009, now Pat. No. 8,758,166, which is a
(Continued)

(51) Int. Cl.
*A63B 43/00* (2006.01)
*A63B 24/00* (2006.01)
(Continued)

(52) U.S. Cl.
CPC ...... *A63B 24/0021* (2013.01); *A63B 37/0003* (2013.01); *A63B 43/00* (2013.01);
(Continued)

(58) Field of Classification Search
None
See application file for complete search history.

(56) References Cited

U.S. PATENT DOCUMENTS 1,620,290 A    3/1927    Rubin
3,782,730 A *  1/1974    Horchler ............ A63B 24/0021
                                                     331/108 R
(Continued)

FOREIGN PATENT DOCUMENTS

DE    87 09 503.3 U1    1/1988
DE    39 26 684 A1      2/1991
(Continued)

OTHER PUBLICATIONS

Extended European Search Report and European Search Opinion for EP Application No. 09155746.2-2220, mailed on Dec. 21, 2009 (6 pages).
(Continued)

*Primary Examiner* — Paul A D'Agostino
(74) *Attorney, Agent, or Firm* — Fish & Richardson P.C.

(57) ABSTRACT

Golf balls for use with a system for finding golf balls and methods for making such golf balls. In the case of one exemplary golf ball, the ball includes a shell, a core material and a tag having a diode which is coupled to an antenna which has at least a portion formed from an elastic conductive material, such as an elastic conductive ink. The core material may include a void for receiving at least part of the diode. Other golf balls are described and methods for making balls are also described.

20 Claims, 23 Drawing Sheets

Related U.S. Application Data division of application No. 10/672,365, filed on Sep. 26, 2003, now Pat. No. 7,691,009.

(51) Int. Cl.
| | |
|---|---|
| A63B 37/00 | (2006.01) |
| G01S 13/04 | (2006.01) |
| G01S 13/75 | (2006.01) |
| G06K 19/077 | (2006.01) |
| H01Q 1/22 | (2006.01) |
| H01Q 1/40 | (2006.01) |
| H05K 1/09 | (2006.01) |
| H05K 1/16 | (2006.01) |

(52) U.S. Cl.
CPC ............ *A63B 43/004* (2013.01); *G01S 13/04* (2013.01); *G01S 13/75* (2013.01); *G06K 19/07758* (2013.01); *H01Q 1/22* (2013.01); *H01Q 1/2225* (2013.01); *H01Q 1/40* (2013.01); *A63B 37/0051* (2013.01); *A63B 2024/0053* (2013.01); *A63B 2225/50* (2013.01); *H05K 1/092* (2013.01); *H05K 1/16* (2013.01); *H05K 2201/10098* (2013.01); *Y10T 29/49018* (2015.01)

(56) References Cited

U.S. PATENT DOCUMENTS

| | | | | |
|---|---|---|---|---|
| 4,299,029 | A | * | 11/1981 | Van Auken .......... A63B 43/004 29/432 |
| 4,331,957 | A | | 5/1982 | Enander et al. |
| 4,433,840 | A | * | 2/1984 | Van Auken .......... A63B 43/004 473/570 |
| 4,528,566 | A | | 7/1985 | Tyler |
| 4,595,200 | A | * | 6/1986 | Shishido ................ A63B 43/00 473/570 |
| 4,660,039 | A | * | 4/1987 | Barricks ............ A63B 24/0021 342/27 |
| 4,698,781 | A | | 10/1987 | Cockerell, Jr. |
| 4,742,357 | A | | 5/1988 | Rackley |
| 4,955,613 | A | | 9/1990 | Gendreau et al. |
| 4,995,613 | A | | 2/1991 | Walker |
| 5,020,803 | A | | 6/1991 | Gendreau et al. |
| 5,112,055 | A | | 5/1992 | Barnhill |
| 5,132,622 | A | | 7/1992 | Valentino |
| 5,298,904 | A | | 3/1994 | Olich |
| 5,316,293 | A | * | 5/1994 | Hamilton ................ A63B 43/00 446/400 |
| 5,388,825 | A | * | 2/1995 | Myers .................... A63B 43/06 473/570 |
| 5,423,549 | A | * | 6/1995 | Englmeier .......... A63B 24/0021 473/353 |
| 5,447,314 | A | * | 9/1995 | Yamazaki .......... A63B 24/0021 473/353 |
| 5,469,175 | A | | 11/1995 | Boman |
| 5,487,542 | A | | 1/1996 | Foley |
| 5,508,350 | A | | 4/1996 | Cadorniga et al. |
| 5,538,794 | A | | 7/1996 | Cadorniga et al. |
| 5,564,698 | A | | 10/1996 | Honey et al. |
| 5,582,550 | A | | 12/1996 | Foley |
| 5,586,950 | A | * | 12/1996 | Endo .................. A63B 37/0003 273/DIG. 22 |
| 5,626,531 | A | * | 5/1997 | Little .................. A63B 24/0021 473/353 |
| 5,662,534 | A | | 9/1997 | Kroll et al. |
| 5,692,973 | A | | 12/1997 | Dalton |
| 5,743,815 | A | | 4/1998 | Helderman |
| 5,789,890 | A | | 8/1998 | Genov et al. |
| 5,820,484 | A | | 10/1998 | Terry |
| 5,910,057 | A | | 6/1999 | Quimby et al. |
| 5,912,700 | A | * | 6/1999 | Honey ............... A63B 71/0605 348/157 |
| 6,027,408 | A | * | 2/2000 | Star .................... A63F 3/00643 333/175 |
| 6,048,279 | A | * | 4/2000 | Masutani .......... A63B 37/0003 473/360 |
| 6,107,920 | A | | 8/2000 | Eberhardt et al. |
| 6,113,504 | A | * | 9/2000 | Kuesters ............ A63B 24/0021 473/152 |
| 6,246,327 | B1 | | 6/2001 | Eberhardt |
| 6,276,266 | B1 | | 8/2001 | Dietz et al. |
| 6,278,402 | B1 | | 8/2001 | Pippin |
| 6,284,840 | B1 | | 9/2001 | Rajagopalan et al. |
| 6,357,664 | B1 | | 3/2002 | Zercher |
| 6,390,935 | B1 | * | 5/2002 | Sugimoto .......... A63B 37/0003 473/373 |
| 6,482,108 | B1 | | 11/2002 | McLaughlin |
| 6,524,199 | B2 | | 2/2003 | Goldman |
| 6,620,057 | B1 | * | 9/2003 | Pirritano ............ A63B 24/0021 342/51 |
| 6,634,959 | B2 | * | 10/2003 | Kuesters ............ A63B 24/0021 473/131 |
| 6,705,942 | B1 | | 3/2004 | Crook et al. |
| 6,762,244 | B2 | | 7/2004 | Rajagopalan et al. |
| 6,840,167 | B2 | | 1/2005 | Clark et al. |
| 7,059,974 | B1 | * | 6/2006 | Golliffe ............. A63B 37/0003 473/351 |
| 7,162,302 | B2 | * | 1/2007 | Wang .................... A61F 2/90 607/36 |
| 7,207,902 | B1 | * | 4/2007 | Hamlin .............. A63B 24/0021 473/353 |
| 7,385,284 | B2 | * | 6/2008 | Carrender .......... G06K 19/0723 257/692 |
| 7,691,009 | B2 | | 4/2010 | Savarese |
| 7,868,766 | B2 | * | 1/2011 | Gengel ................ G06K 19/027 235/492 |
| 2001/0006489 | A1 | | 7/2001 | Gaffney |
| 2001/0045904 | A1 | | 11/2001 | Silzer, Jr. |
| 2002/0004723 | A1 | | 1/2002 | Meifu et al. |
| 2002/0016674 | A1 | | 2/2002 | Rudow et al. |
| 2002/0027524 | A1 | | 3/2002 | Pippin |
| 2002/0082120 | A1 | | 6/2002 | McLaughlin |
| 2002/0091017 | A1 | | 7/2002 | Kuesters |
| 2002/0098913 | A1 | | 7/2002 | Goldman |
| 2002/0177490 | A1 | | 11/2002 | Yong et al. |
| 2002/0188359 | A1 | | 12/2002 | Morse |
| 2003/0008727 | A1 | | 1/2003 | Miller |
| 2003/0017884 | A1 | | 1/2003 | Masters et al. |
| 2003/0106634 | A1 | * | 6/2003 | Adkins .............. A63B 24/0021 156/215 |
| 2003/0109330 | A1 | * | 6/2003 | Nesbitt .................. A63B 37/00 473/371 |
| 2003/0175411 | A1 | * | 9/2003 | Kodas .................. C09D 11/30 427/58 |
| 2003/0191547 | A1 | * | 10/2003 | Morse ................ A63B 24/0021 700/91 |
| 2004/0014536 | A1 | | 1/2004 | Kuesters |
| 2004/0053708 | A1 | | 3/2004 | Hebert |
| 2004/0058749 | A1 | * | 3/2004 | Pirritano ............ A63B 24/0021 473/353 |
| 2004/0142766 | A1 | | 7/2004 | Savarese et al. |
| 2005/0070376 | A1 | | 3/2005 | Savarese et al. |
| 2007/0026968 | A1 | * | 2/2007 | Ratcliffe ............ A63B 24/0021 473/353 |
| 2007/0167247 | A1 | * | 7/2007 | Lindsay ............ A63B 24/0021 473/131 |
| 2009/0167534 | A1 | * | 7/2009 | Gengel ................ G06K 19/027 340/572.7 |

FOREIGN PATENT DOCUMENTS

| | | |
|---|---|---|
| DE | 100 57 670 C1 | 3/2002 |
| EP | 1 035 418 A1 | 9/2000 |
| FR | 2667 510 A | 4/1992 |
| GB | 2395 438 A | 5/2004 |
| JP | 2003085510 A | 3/2003 |
| JP | 2003158414 A | 5/2003 |

(56) References Cited

FOREIGN PATENT DOCUMENTS

| WO | WO 01/02060 A1 | 1/2001 |
| WO | WO 01/02061 A1 | 1/2001 |
| WO | WO 03/068874 A1 | 8/2003 |

OTHER PUBLICATIONS

PCT International Preliminary Report on Patentability for PCT International Appln No. US2004/027598, mailed on Apr. 6, 2006 (8 pages).
PCT International Preliminary Report on Patentability for PCT International Appln No. US2006/039416, mailed on Apr. 24, 2008 (8 pages).
PCT International Preliminary Report on Patentability for PCT International Appln No. US2004/027597, mailed on Apr. 6, 2006 (8 pages).
PCT International Preliminary Report on Patentability for PCT International Appln No. US2004/001126, mailed Aug. 4, 2005 (14 pages).
PCT Invitation to pay additional fees for PCT International Appln No. US04/001126, mailed Aug. 2, 2004 (5 pages).
PCT Search Report and Written Opinion for PCT International Appln No. US2004/001126, mailed Mar. 31, 2005 (21 pages).
PCT Search Report and Written Opinion for PCT International Appln No. US2004/027597, mailed Nov. 19, 2004 (13 pages).
PCT Search Report and Written Opinion for PCT International Appln No. US2004/027598, mailed Dec. 7, 2004 (13 pages).
PCT Search Report and Written Opinion for PCT International Appln No. US2006/039416, mailed Jan. 29, 2007 (14 pages).

* cited by examiner

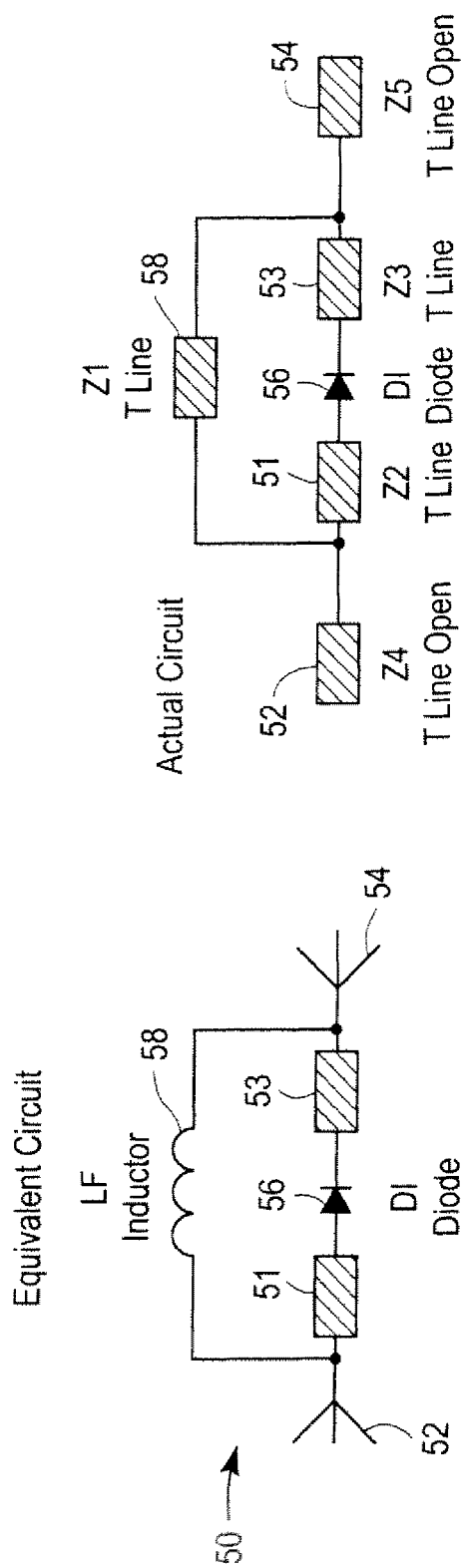

Antenna On Core
(Not To Scale)
Shown On A 3-piece Ball

Side View

Top View

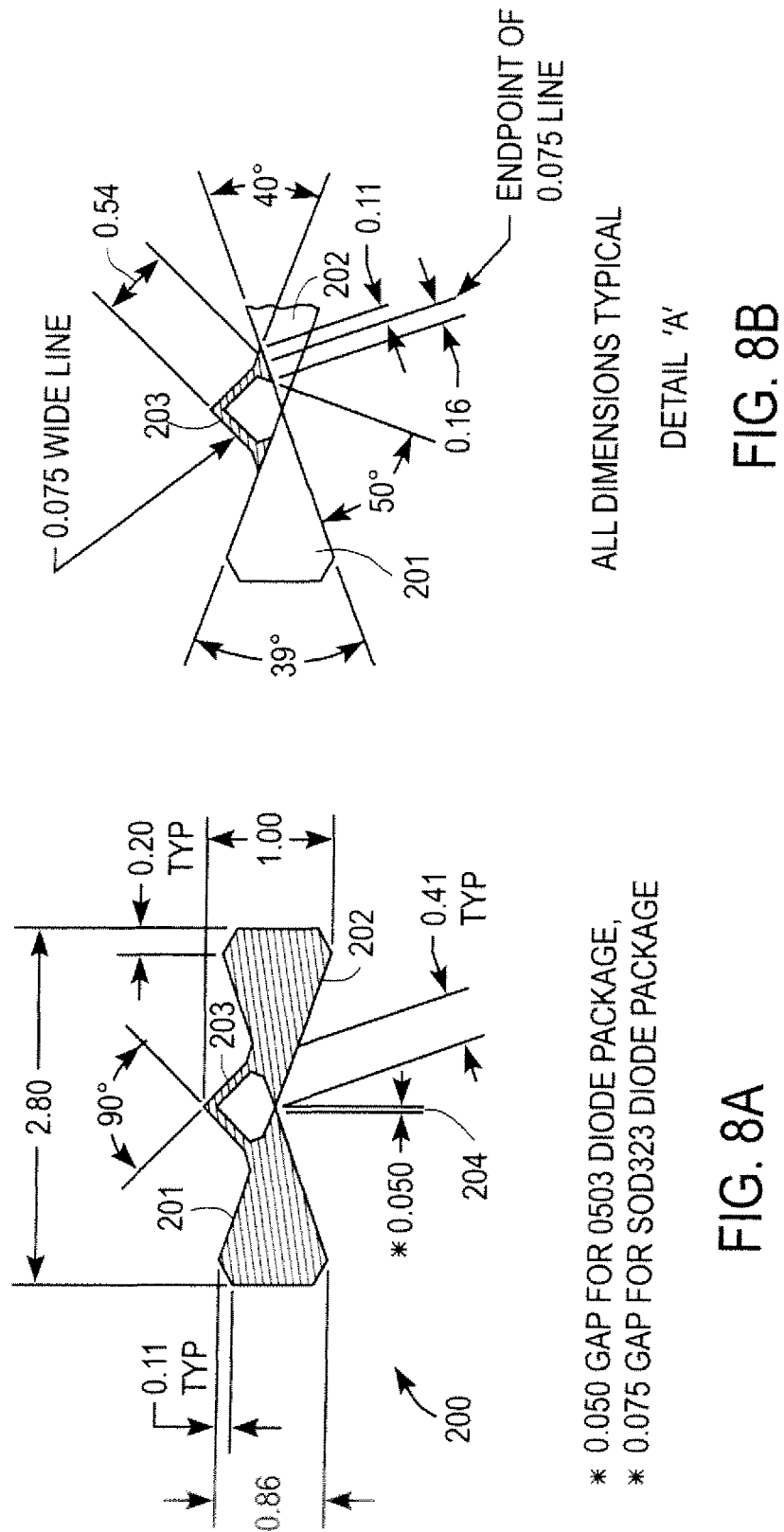

APPARATUSES AND METHODS RELATING TO FINDABLE BALLS

This application is a continuation of co-pending U.S. patent application Ser. No. 12/552,162 filed on Sep. 1, 2009, which is a divisional of U.S. patent application Ser. No. 10/672,365 filed on Sep. 26, 2003, now issued as U.S. Pat. No. 7,691,009.

FIELD OF THE INVENTION

The invention is related to sports, such as golf, and more particularly to golf balls, and methods for making golf balls and systems for use with golf balls.

BACKGROUND OF THE INVENTION

Golf balls are often lost when people play golf. The loss of the ball slows down the game as players search for a lost ball, and lost balls make the game more expensive to play because of the cost of new balls. Furthermore, according to the rules of the U.S. Golf Association, a player is penalized for strokes in a round or game of golf if his/her golf ball is lost.

There have been attempts in the past to make findable golf balls in order to avoid some of the problems caused by lost balls. One such attempt is described in German Patent No. G 87 09 505.3 (Helmut Mayer, 1988). In this German patent, a two-piece golf ball is fitted with foil reflectors which are glued to the outer layer of the core. A shell surrounds the foil reflectors and the core. Each of the reflectors consists of a two-part foil antenna with a diode connected on the inner ends. The diode causes a reflected signal to be double the frequency of a received signal. A 5-watt transmitter, which is used to beam a signal toward the reflectors, is used to find the ball. The ball is found when a reflected signal is generated by the foil antenna and diode and reflected back toward a receiver. It has been discovered that this all foil antenna does not provide a durable antenna and that the ball will not be findable (e.g. findable for a distance of greater than 20 feet) after only a few hits on the ball.

Another attempt in the art to make a findable golf ball is described in PCT Patent Application No. WO 0102060 A1, which describes a golf ball for use in a driving range. This golf ball includes an active radiofrequency identification device (RFID) which identifies a particular ball. The RFID includes an active (e.g. contains transistors) ASIC chip which is energized from a received radio signal. The RFID device is mounted in the sealed capsule which is placed within the core of the ball. The RFID device is designed to be used only at short range (e.g. less than about 10 feet). The use of a sealed capsule to hold the RFID within the ball increases the expense of making this ball and is believed to degrade the performance of the ball.

Other examples of attempts in the prior art to make findable golf balls include U.S. Pat. Nos. 5,626,531; 5,423,549; 5,662,534; and 5,820,484.

SUMMARY OF THE DESCRIPTION

Apparatuses, methods and systems relating to findable golf balls are described herein.

In one exemplary embodiment of an aspect of the invention, a golf ball includes a shell, a core material which is encased within the shell, and a tag having a diode which is coupled to an antenna which has at least a portion formed from an elastic conductive material which is encased within an outer surface of the shell.

In another exemplary embodiment, a high durability golf ball includes a ball material and a tag coupled to the ball material. The tag includes an electrical component (e.g. a diode or transistor) which is coupled to an antenna, and the tag has a substantially curved outer surface which substantially conforms to a surface of a sphere. The golf ball is durably detectable (e.g. after 20 cannon test hits) over a range of at least about 20 feet.

In another exemplary embodiment, a golf ball includes a shell, a core material which is encased within the shell, wherein the core material has a void on an outer surface of the core material, and a tag having a diode which is coupled to an antenna, wherein the diode has at least a portion thereof disposed in the void.

In another exemplary embodiment, a golf ball includes a ball material having a template, and the tag which is coupled to the ball material, wherein the tag includes an antenna which is formed in a pattern defined at least in part by the template.

A method of making a golf ball, according to an exemplary embodiment of another aspect of the invention, includes forming a first member having an outer surface, depositing a liquid material which, when dried, forms at least one antenna which is electrically conductive, and forming a second member which surrounds the at least one antenna.

A method of making a golf ball according to another exemplary embodiment includes forming a first member having an outer surface, forming a void in the outer surface, wherein the outer surface forms at least a portion of a sphere's surface, depositing at least a portion of a diode into the void, coupling the diode to an antenna formed on the outer surface, and forming a second member which surrounds the antenna.

A method of making a golf ball according to another exemplary embodiment described herein, includes forming a first member having an outer surface, depositing onto the outer surface an elastic conductive material which forms an elastic antenna, coupling a diode to the elastic antenna, and forming a second member which surrounds the elastic antenna.

A method of making a golf ball, according to another exemplary embodiment described herein, includes forming a structure for an antenna on a first substrate, forming a first member having an outer surface, transferring said structure from said first substrate to said first member, and forming a second member which surrounds said antenna.

Various embodiments described herein will provide a golf ball which is detectable with a handheld transmitting/receiving device over a range of at least 20 feet (separating the tag and the handheld transmitting/receiving device). Certain of these embodiments provide golf balls which have high durability, such that most such balls can normally survive at least 20 cannon hits using standard testing methodology used by the golf industry. Further, many of the golf balls provided by the various embodiments may substantially comply with golf ball specifications of the U.S. Golf Association or the golf ball specifications of the Royal and Ancient Golf Club of St. Andrews. Further, certain embodiments of the golf balls described herein may be detectable with a handheld transmitting/receiving device which is capable of detecting a tag over a range of at least 20 feet and which complies with regulations of the Federal Communications Commission. For example, in certain of these embodiments, golf balls may be detectable at a range of at least 20 feet, while the transmitter transmits less than or equal to about 1 watt maximum peak power or about 4 watts isotropic radiated power.

Other embodiments of golf balls and methods of making such golf balls are described. Other features and embodiments of various aspects of the various inventions will be apparent from this description.

BRIEF DESCRIPTION OF THE DRAWINGS

The present invention is illustrated by way of example and not limitation in the figures of the accompanying drawings in which like references indicate similar elements.

FIG. 2A is an electrical schematic which illustrates an embodiment of a circuit for a tag according to one aspect of the invention.

FIG. 2B shows a structural representation of the circuit of FIG. 2A.

FIG. 8A shows a plane view of a particular embodiment of a tag's antenna, with an inductive element; this view includes actual measurements, in inches, for the particular antenna.

FIG. 8B is a plane view of a portion of the antenna shown in FIG. 8A which additional dimensions being shown.

DETAILED DESCRIPTION

The subject invention will be described with reference to numerous details set forth below, and the accompanying drawings will illustrate the invention. The following description and drawings are illustrative of the invention and are not to be construed as limiting the invention. Numerous specific details are described to provide a thorough understanding of the present invention. However, in certain instances, well known or conventional details are not described in order to not unnecessarily obscure the present invention in detail.

Various embodiments and aspects of the invention will be described with reference to details set below, and the accompanying drawings will illustrate the invention. The following description and drawings are illustrative of the invention and are not to be construed as limiting the invention. Numerous specific details such as sizes and weights and frequencies are described to provide a thorough understanding of various embodiments of the present invention. However, in certain instances, well-known or conventional details are not described in order to not unnecessarily obscure the present invention in detail.

Figure 1A:
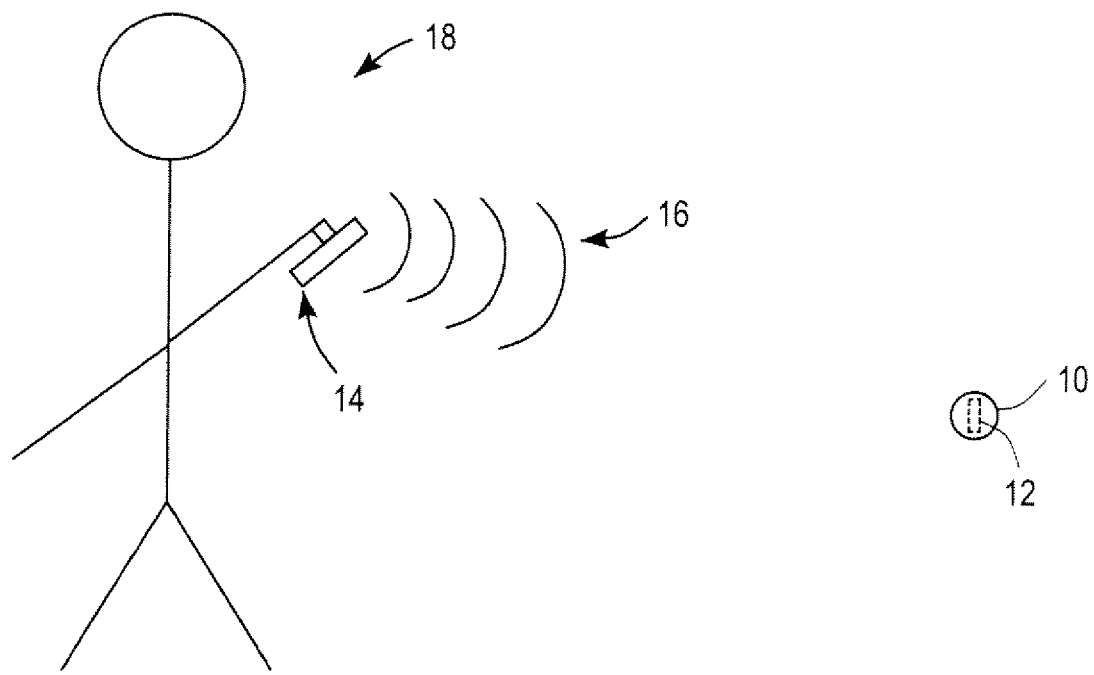
FIG. 1A shows a system for finding a golf ball according to one embodiment of the present invention.

FIG. 1A shows an example of the system which uses a handheld transmitter/receiver to find a findable golf ball. A person 18 such as a golfer, may carry a handheld transmitter/receiver which is designed to locate a findable golf ball 10 which includes a tag 12 embedded in the golf ball. The handheld transmitter/receiver 14 may operate as a radar system which emits an electromagnetic signal 16 which then can be received, converted and transmitted by the tag 12 back to the transmitter/receiver which can then receive the signal from the tag in a receiver in the handheld unit 14. Various different types of tags, such as tag 12, are described further below for use in the golf ball 10. These tags typically include an antenna and a diode coupled to the antenna. The diode serves to double the frequency of the received signal (or to provide another harmonic of the received signal), which makes it easier for the receiver to detect and find a golf ball as opposed to another object which has reflected the emitted signal without modifying the frequency of the emitted signal. The tag within the golf ball 10 is typically positioned such that the symmetry of the ball is substantially maintained. For example, the center of gravity (and symmetry) of a ball with a tag is substantially the same as a ball without a tag. The tag in certain embodiments is of such a weight and size so that the resulting ball containing the tag has the same weight and size as a ball which complies with the United States Golf Association specifications or the specifications of the Royal & Ancient Golf Club of St. Andrews ("R&A"). The various parts of a tag may be made with materials which are designed to match the density/specific gravity of the materials within the golf ball which are displaced by the tag. For example, the elastic conductive material, which may be used as an antenna in certain embodiments described herein, may be selected to have a density/specific gravity which approximates the density/specific gravity of a core material or a shell material of a golf ball. Furthermore, in certain embodiments, a ball with a tag has the same performance characteristics (e.g. initial velocity) as balls which were approved for use by the United States Golf Association or the R&A.

Figure 1B:
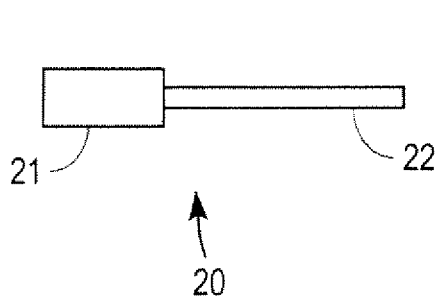
FIG. 1B is a side view of an exemplary embodiment of a handheld transmitter/receiver which may be used with embodiments of the present invention.
Figure 1C:
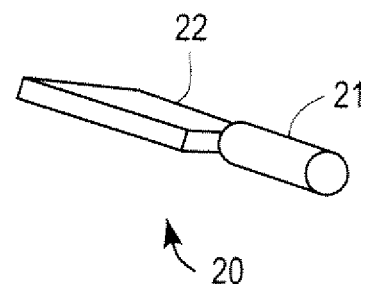
FIG. 1C is a perspective view of a handheld transmitter/receiver of FIG. 1B.

The handheld unit 14 shown in FIG. 1A may have the form shown in FIGS. 1B and 1C. This form, shown in FIGS. 1B and 1C, is one example of many possible forms for a handheld unit. For example, alternative forms may not include a handle. This handheld device is typically a small device having a cylindrical handle which may be 4-5 inches long, and may have a diameter of approximately 1.5 inches. The cylindrical handle, such as handle 21, is attached to a six-sided solid which includes an antenna, such as the antenna casing 22 shown in FIGS. 1B and 1C. FIG. 1B is a side view of a handheld transmitter/receiver which may be used in certain embodiments of the present invention. FIG. 1C is a perspective view of a handheld unit shown in FIG. 1B. The handheld unit is preferably compliant with all regulations of the Federal Communications Commission and is battery powered. The batteries may be housed in the handle 21, and they may be conventional batteries which may be placed into the handle by a user or they may be rechargeable batteries which can be recharged either through the use of an AC wall/house socket or a portable rechargeable unit (e.g. in a golf cart). In order to comply with regulations of the Federal Communications Commission (FCC) or other applicable governmental regulations regarding radio equipment, the handheld may emit pulsed (or non-pulsed) radar signals with a power that is equal to or less than 1 watt. In certain embodiments, the handheld unit may emit through its transmitter pulsed radar signals up to 1 watt maximum peak power and up to 4 watts effective isotropic radiated power (EIRP). Thus, the handheld unit for locating golf balls may be sold to and used by the general public in the United States. Several embodiments of handheld transmitters/receivers are described in a prior U.S. patent application filed Jan. 17, 2003 as Ser. No. 10/346,919, by inventors Chris Savarese, et al. At least some of these embodiments may be sold to and used by the general public in countries other than the United States because the embodiments meet regulatory requirements of those countries. For example, a handheld unit for use and sale in the European Union will normally be designed and manufactured to meet the CE marking requirements and the National Spectrum Authority requirements per the R&TTE (Radio and Telecommunications Terminal Equipment) Directive. In other countries, the regulatory regimes in those countries would normally be considered in designing a handheld unit. While certain embodiments described herein use a handheld transmitting/receiving device to find a ball, it will be appreciated that alternative embodiments may use a transmitting/receiving device which is on a golf cart or on a golf bag or on other golf equipment or golf attire (e.g. a golf cap). These alternative embodiments may not be units which are designed to be held in a hand or they may also be holdable in a hand.

FIG. 2A shows an electrical schematic of a tag according to one embodiment. The circuit of the tag 50 includes an antenna having two portions 52 and 54. The portion 52 is coupled, through a transmission line 51, to one end of the diode 56 and the portion 54 is coupled, through a transmission line 53, to the other end of the diode 56. A transmission line 58 which forms an inductor is coupled in parallel across the combination of the diode 56 and the transmission lines 51 and 53 as shown in FIG. 2A. The diode 56 is designed to double the received frequency so that the transmitted signal from the tag is twice (or some harmonic) of the received signal. It will be appreciated that the double harmonic described herein is one particular embodiment, and alternative embodiments may use different harmonics or multiples of the received signal. FIG. 2B shows a structural representation of the circuit of FIG. 2A. In particular, FIG. 2B shows the antenna portions 52 and 54 coupled, through transmission lines 51 and 53, to their respective ends of the diode 56 which is in turn coupled to a transmission line 58. The diode may be a varactor diode, a Schottky diode, a step recovery diode or a transistor that is wired as a diode. In one exemplary embodiment of the circuit 50, the diode 56 may be a Schottky diode from Metelics Corporation, part number SMSD3004-SOD323, which is available in a package referred to as an SOD323 package. In an alternative embodiment, the diode 56 may be a Metelics diode in a leadless package such as an 05-03 package. In other embodiments, the diode 56 may, for example, be a diode from M/A-Com, part number MA4E2054-1141. The circuits shown in FIGS. 2A and 2B may be implemented in structures that have various different shapes and configurations as will be apparent from the following description.

Figure 3A:
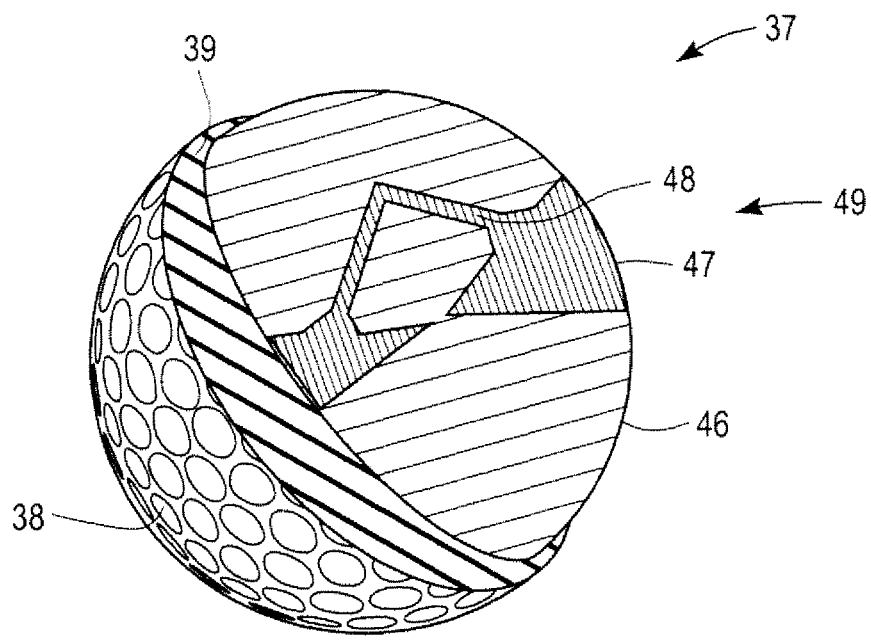
FIG. 3A shows a perspective view of a golf ball which has three pieces and wherein certain of those pieces have been removed partially in order to show the arrangement of a radial transmission line based antenna on the core of the golf ball.

FIG. 3A shows a perspective view of a three-piece golf ball having a core 46, a middle layer 39, and an outer shell 38. The core may be formed from various existing materials which are used to form golf ball cores, and particularly golf ball cores used in three-piece golf balls. Similarly, the middle layer 39 and the outer shell 38 may be formed with existing materials which are used in existing three-piece golf balls. The view of FIG. 3A shows the ball partially peeled so that it can be seen that the outer shell 38 normally surrounds the spherical core 46 as well as the layer 39. The golf ball of FIG. 3A includes a tag 49. The tag 49, in this embodiment, includes three components: an antenna 47, and inductive element 48, and a diode (not shown) which is coupled between the two radial transmission lines which are separated and interconnected by the diode as further described below. The antenna 47 and the inductive element 48 may, in one embodiment of the invention, be formed from an elastic conductive material which is applied or deposited onto the core as described herein. In one exemplary embodiment, the elastic conductive material may be a cured conductive ink which is elastic after curing. An example of such a substance is Electrodag PF-046 from Acheson Colloids Company of Port Huron, Mich. (see www.achesonindustries.com). Electrodag PF-046 is a screen printable, silver-filled polymer thick film based on a mixture of thermoplastic resins. It is formulated to provide outstanding flexibility, high conductivity, and excellent adhesion to a wide variety of substrates. The material has outstanding flexibility and is elastic after curing or drying. The elastic nature of this material tends to make it self-healing, even in the face of the extreme stress of being in a golf ball. The material may be applied in a variety of ways including manual painting, ink jetting, pad printing, lithographic (e.g. transfer) printing, etc. The material may be applied through the use of a template, which is further described below. The conductive ink may itself be used to form a connection with the contact pads on a diode or a separate compressible, elastic conductor may be utilized to couple the contact pads of a diode to the respective radial transmission lines which make up the antenna 47. It has been found that the use of an elastic conductive material for the antenna allows for greater tag and ball durability than an all foil antenna which is placed between the core and the shell of a golf ball. It has been discovered that such a foil antenna will not survive cannon test hits. Thus, golf balls which use solely foil antennas will not satisfy durability requirements because such balls will not be findable after 1 or a few (e.g. less than 10) cannon test hits; in other words, after a few cannon test hits, the foil antenna will have cracked and been ruptured into pieces which cannot properly function and will not allow the ball to be found at distances greater than about 20 feet. Even if the ball survives cannon test hits, the tag will not, and thus the ball and the tag are not durably findable.

A generally accepted durability standard in the golf ball manufacturing industry involves the use of a cannon test hit. A golf ball is generally considered durable if it can survive about 40 cannon test hits. Normally, a sample of such golf balls are tested, and if most (more than 50%) survive 40 cannon test hits, then the golf ball is considered sufficiently durable. Normally, a golf ball is considered to have survived if it shows no structural failures; a structural failure includes a crack or a seam or a distortion of the ball's shape (e.g. a flattened portion) or a removal of a portion of the ball (e.g. the shell separates from the core) or the ball is split into portions (e.g. it cracks into two hemispherical pieces). A typical cannon testing procedure uses a COR (and durability) tester machine from Hye Precision Products (www.hyeprecision.com). The machine has variable compressed air settings for selecting a desired pressure in order to obtain a desired initial velocity for a ball being tested. The machine has an automatic return system which collects the balls after they are hit and returns them for another hit. Typically, twelve (12) balls are loaded and each ball is automatically introduced on a cycle run. It takes about 12 seconds for each hit/cycle. A round of 12 balls will cycle through the machine every two minutes. The cycle allows a ball to cool down after each hit. A ball is loaded inside a barrel with a diameter slightly larger than the ball's diameter (barrel diameter=1.70" and barrel length=18"). The machine hits the ball with a plunger, driven at an air pressure of 39 psi (pounds per square inch), such that the ball is propelled through the barrel with an initial velocity of about 145 ft/sec. The ball is hit against a 3-inch metal block which is 21.5 inches away from the end of the barrel. The ball bounces off the metal block and goes into a return chute and is reloaded during a cycle with other balls. The ball is hit/cycled and reloaded 40 times.

Figure 3B:
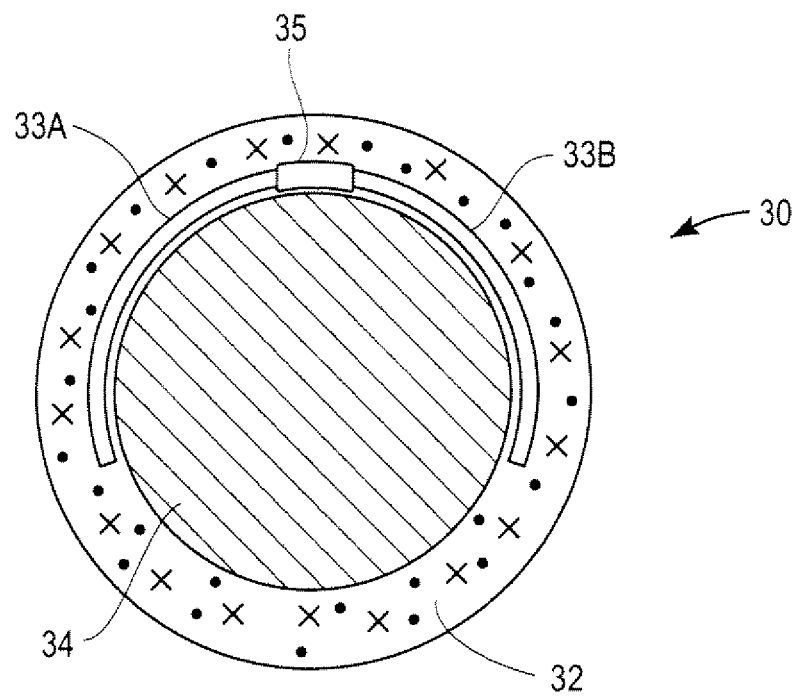
FIG. 3B shows a cross-sectional view of a two-piece golf ball with a tag between the shell and core of the golf ball.
Figure 3C:
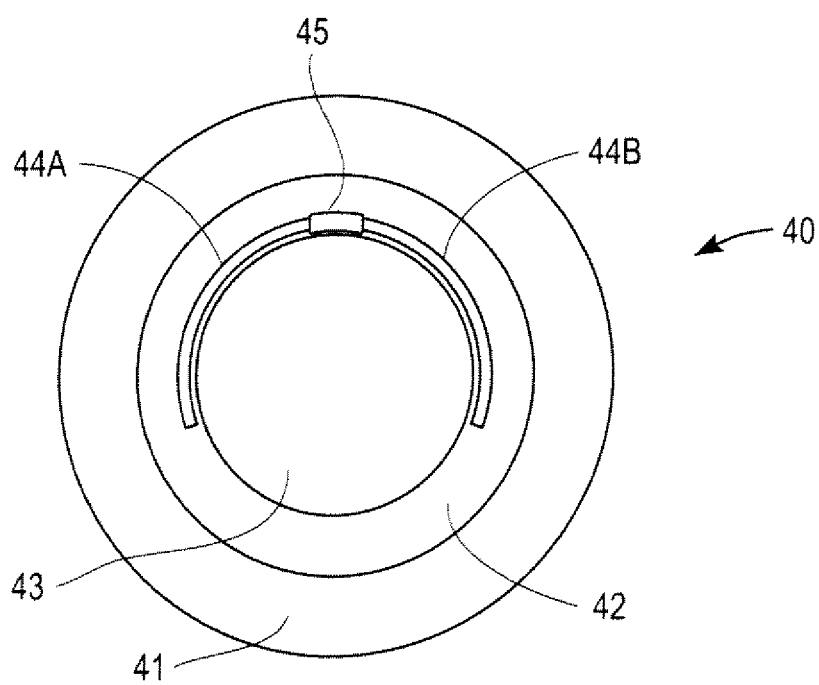
FIG. 3C shows a cross-sectional of a three-piece golf ball having a tag disposed between a middle layer and the core of the golf ball.

FIG. 3B shows a cross-sectional view of a two-piece golf ball which includes a tag between the core 34 and the shell 32. The golf ball 30 has a tag which includes a diode 35 and two antenna portions 33A and 33B. In one embodiment, the antenna portions 33A and 33B may be radial transmission lines which are described further below. FIG. 3C shows a cross-sectional view of a golf ball 40 which is a three-piece golf ball having a core 43 which is surrounded by a middle (or mantle) layer 42 which in turn is surrounded by an outer shell 41. A tag is disposed between the core 43 and the middle layer 42. This tag includes a diode 45 as well as antenna portions 44A and 44B. In an alternative embodiment of a three-piece ball, a tag may be disposed between the mantle layer and the outer shell layer. The antenna portions of the tag shown in FIG. 3B and the antenna portions of the tag shown in FIG. 3C (as well as the antenna portions of the tags shown in FIGS. 4A through 6F) may advantageously be fabricated using an elastic conductive material such as a conductive ink, which may be, in one embodiment, a polymer with metal particles disposed or dispersed in the polymer. The flexibility and elasticity of the antenna will allow the antenna and tag to withstand the tremendous stress placed on a golf ball when it is hit by a golfer.

Figure 4A:
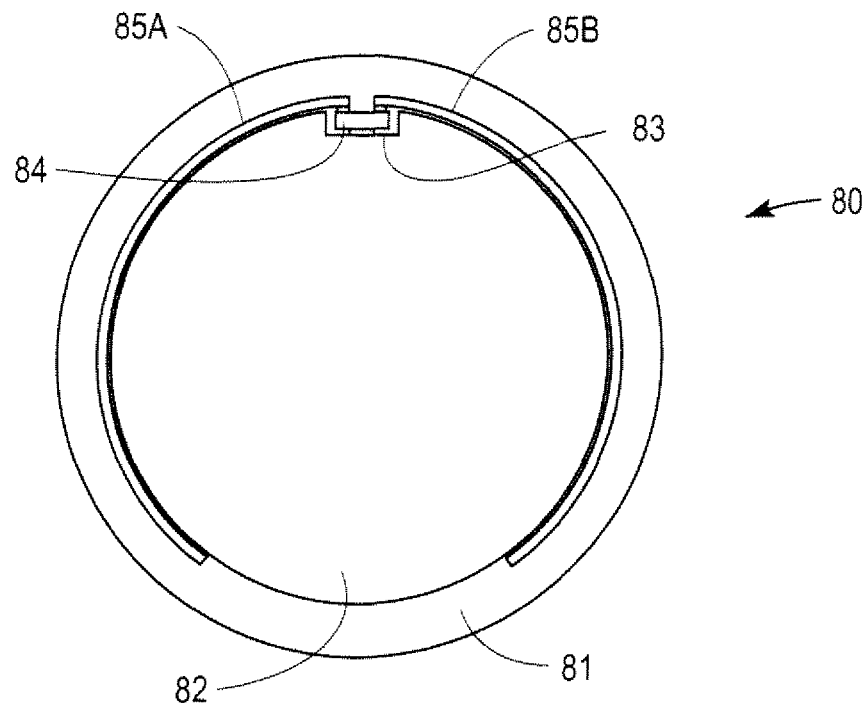
FIG. 4A shows a cross-sectional view of a two-piece golf ball which includes a void or cavity to receive an electrical component such as a diode.
Figure 4B:
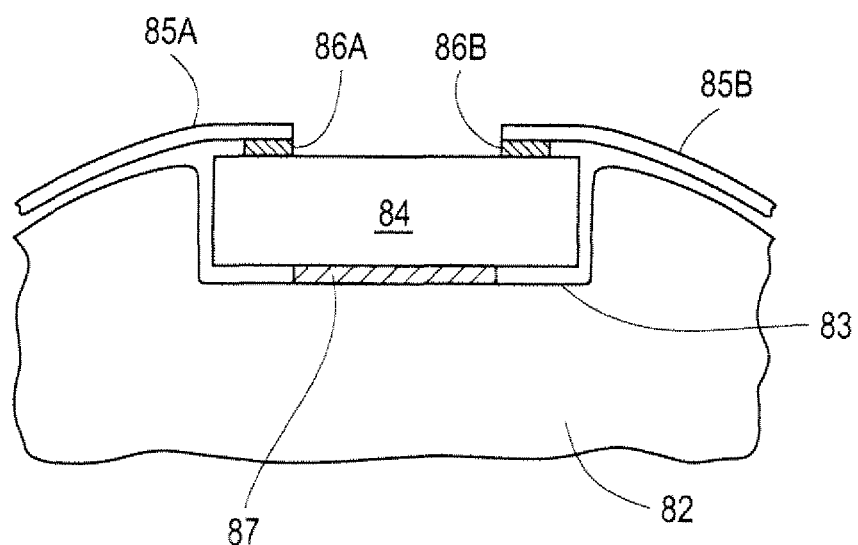
FIG. 4B shows an enlarged view of a portion of the golf ball shown in FIG. 4A.

FIG. 4A shows a cross-sectional view of a two-piece golf ball 80 which includes a core material 82 and a shell 81 which surrounds the spherical core material 82. A tag is disposed between the inner surface of the shell 81 and the outer spherical surface of the core material 82. This tag includes a diode 84 which is coupled between antenna portions 85A and 85B. The antenna pattern created by the antenna portions 85A and 85B may resemble any one of the antenna patterns shown in FIGS. 8A-8G and may be formed from a conductive elastic material. The diode 84 is disposed at least partially in a void or cavity 83 in the core material 82 as shown in FIG. 4A. FIG. 4B shows, in cross-sectional view, an enlarged view of the portion of the core 82 around the void 83. It can be seen from FIG. 4B that the diode 84 is at least partially disposed in the void 83 and is coupled to the void 83 by an optional adhesive 87 which is disposed between the diode 84 and the core material 82. The diode 84 includes electrical contact pads 86A and 86B which are coupled to respective portions of the antenna portions 85A and 85B. The diode 84 may resemble the leadless diode shown in FIG. 7A and in FIG. 7B. However, other configurations may also be used such as the diode shown in FIG. 7C.

The void in the core material 82 helps to protect the diode during the manufacturing process and helps protect the diode from harm when the golf ball is struck by a golfer. Thus this tends to improve the durability of a golf ball such as that shown in FIG. 4A. The void also tends to keep the diode (or other component) properly positioned and coupled to the antenna during an injection molding process when the ball is being manufactured. It has been discovered that without such a void, a diode tends to be dislodged away from the antenna during the injection molding process (e.g. when a shell is applied over the antenna and diode) and accordingly may result in the diode being disconnected from the antenna. A low profile diode (or other electrical component) may be placed in such a void or may be used without a void if its low profile permits such diode to be used in a manufacturing process (e.g. the injection molding process).

Figure 4C:
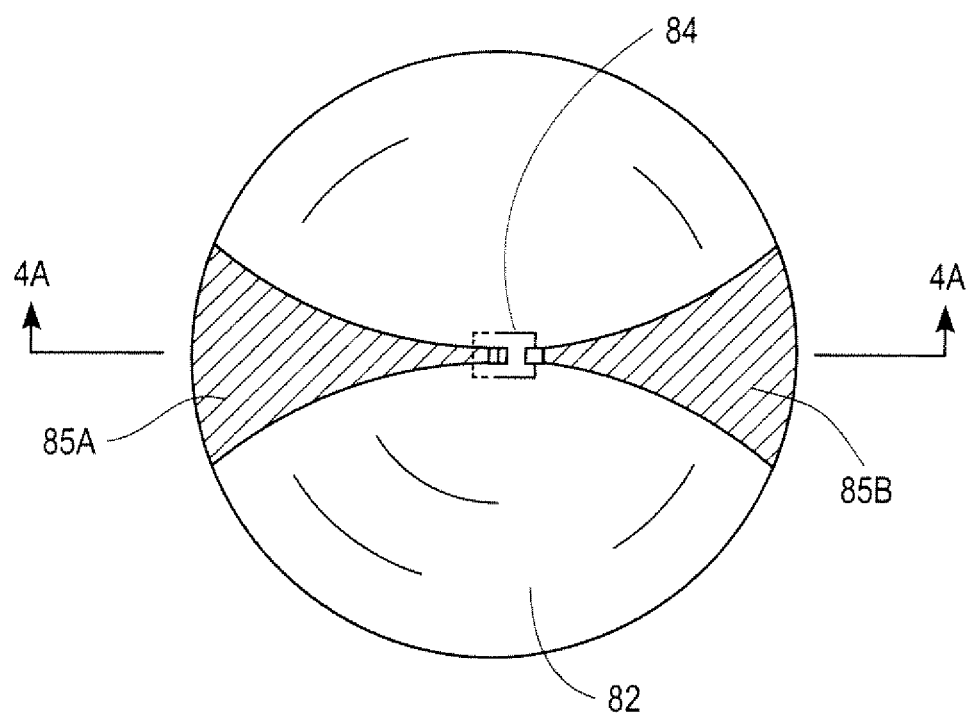
FIG. 4C shows a top perspective view of the golf ball of FIG. 4A, wherein the cross-sectional view of FIG. 4A is shown by the line 4A-4A in FIG. 4C.

FIG. 4C shows a top perspective view of the core and tag of a golf ball 80 with the shell 81 not yet applied over the tag and the core. The cross-sectional view of FIG. 4A is taken at line 4A-4A as shown in FIG. 4C. The antenna portions 85A and 85B are patterned as radial transmission lines, each of which are coupled to respective electrical contact pads on the diode 84. The use of radial transmission lines as the antenna portions for a tag in a golf ball are further described below. The antenna of the tag shown in FIG. 4C does not include an inductive element which is an optional element which may be added to the antenna pattern to improve electrical characteristics of the tag; for example, through the use of an inductive element, the impedance or reactance of the antenna may be matched with the impedance or reactance of the electrical component which in this case is a diode.

Figure 5A:
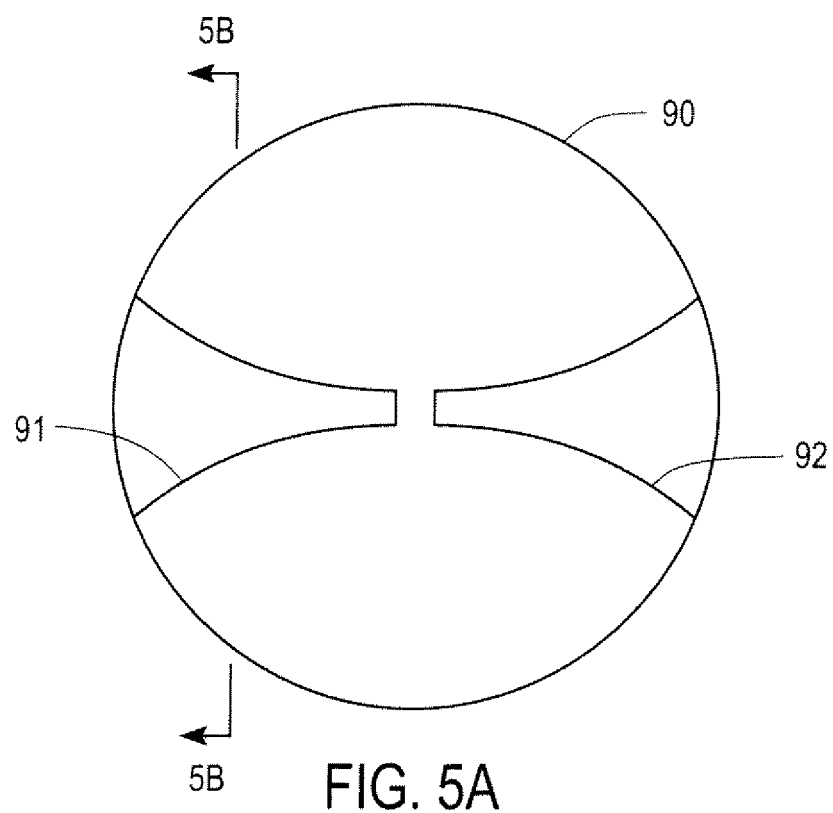
FIG. 5A shows a top perspective view of a golf ball core which includes a template for forming an antenna pattern.
Figure 5B:
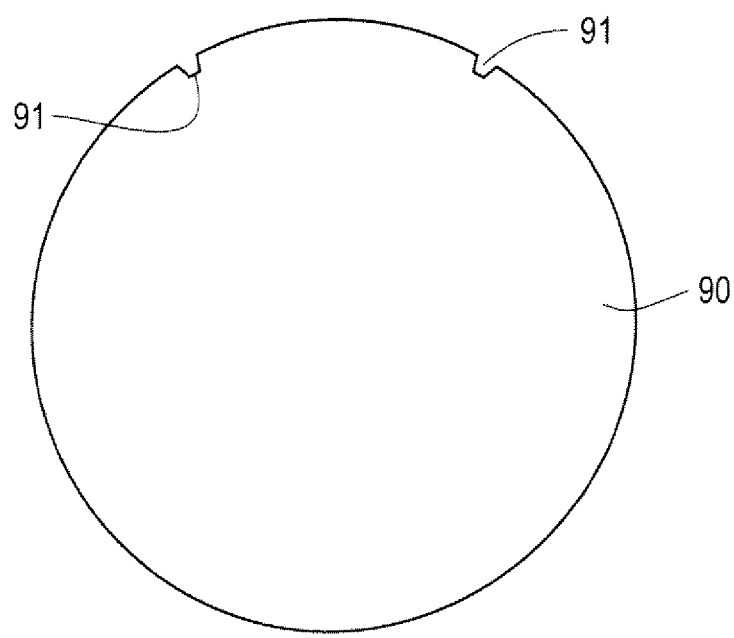
FIG. 5B shows a cross-sectional view of the core of FIG. 5A taken at the cross-sectional point illustrated by line 5B-5B shown in FIG. 5A.
Figure 10:
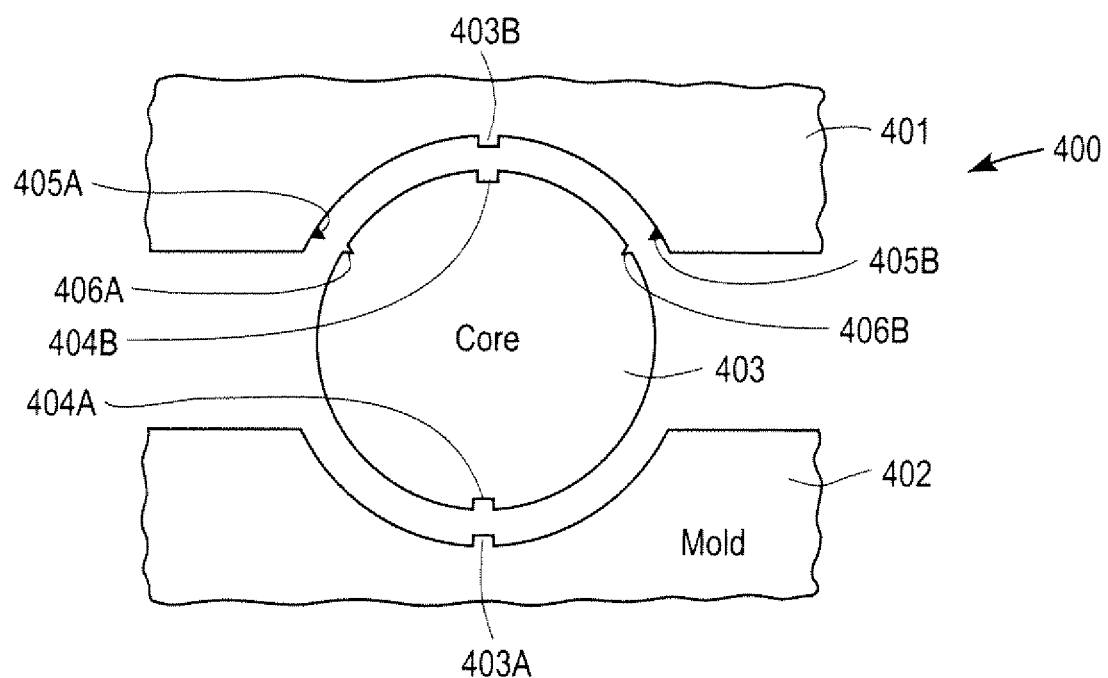
FIG. 10 shows, in cross-sectional view, a mold and core combination for forming an exemplary embodiment of a golf ball core.

Certain embodiments of the present invention may utilize a template on the core or other layer to assist in the creation of an antenna pattern onto the core or other layer. For example, the template may allow a person to manually paint a conductive liquid ink onto the core or other layer by constraining the position of the paint within a boundary defined by the template. FIGS. 5A and 5B show an example of one such template. It will be appreciated that numerous different types of templates may be utilized and that the template of FIGS. 5A and 5B is one example of such different templates. FIG. 5A shows a top perspective view of a core 90 of a golf ball. The core includes a template which in this case are two grooves 91 and 92 formed in the core 90. The cross-sectional view of FIG. 5B, which is taken along the line 5B-5B shown in FIG. 5A, shows how the groove 91 extends into the core material of the core 90. These grooves may be formed in the process of molding the core in a mold which includes protrusions which form the grooves. An example of such a mold is shown in FIG. 10 and will be described further below. The grooves set a boundary which defines the perimeter of the antenna pattern and this boundary may be used by a person who manually paints (e.g. with a paintbrush) the antenna pattern onto the core. It will be appreciated that the grooves may have a variety of shapes, such as a "v" shape or a "u" shape or a "w" shape. Alternatively, rather than a groove, a protrusion which extends beyond the spherical surface of the core may be used as a template. Other types of templates may include a demarcation such as a discoloration or other visually perceptible effect which forms a line or boundary indicator on the core or other layer where the antenna pattern is to be created.

Figure 6A:
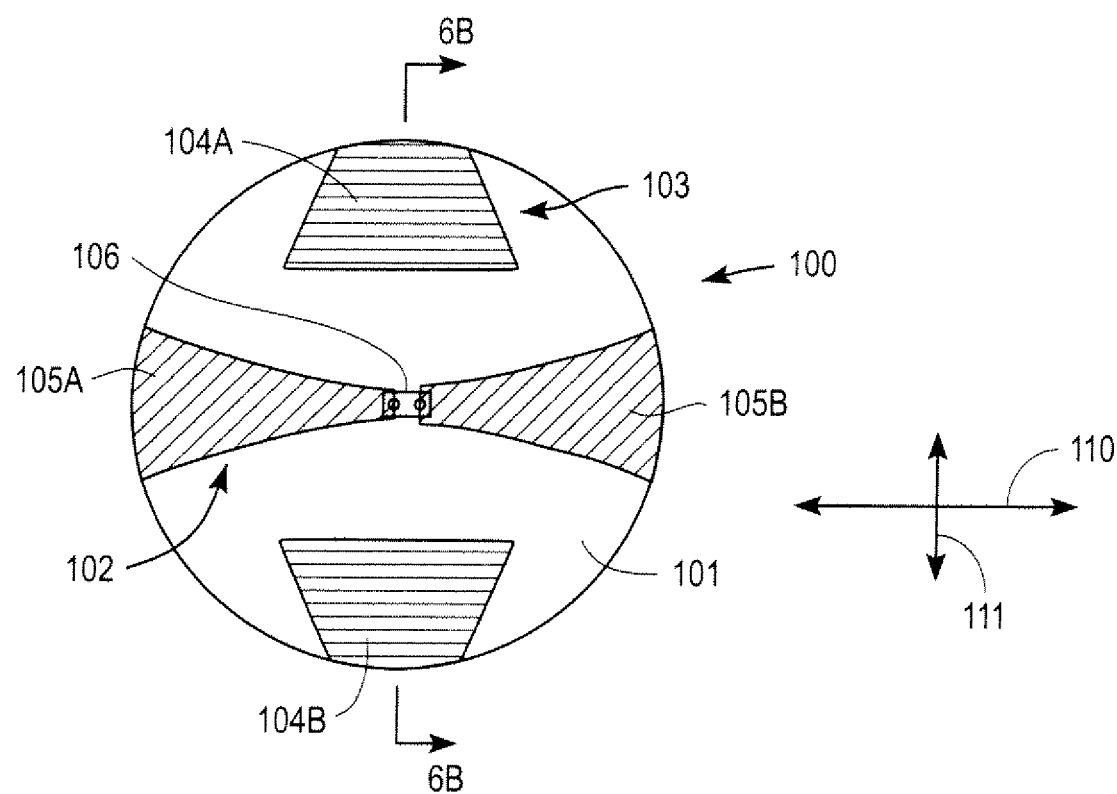
FIG. 6A is top perspective view of a core of a golf ball having a pair of tags, each of which includes radial transmission lines for their antenna patterns.
Figure 6B:
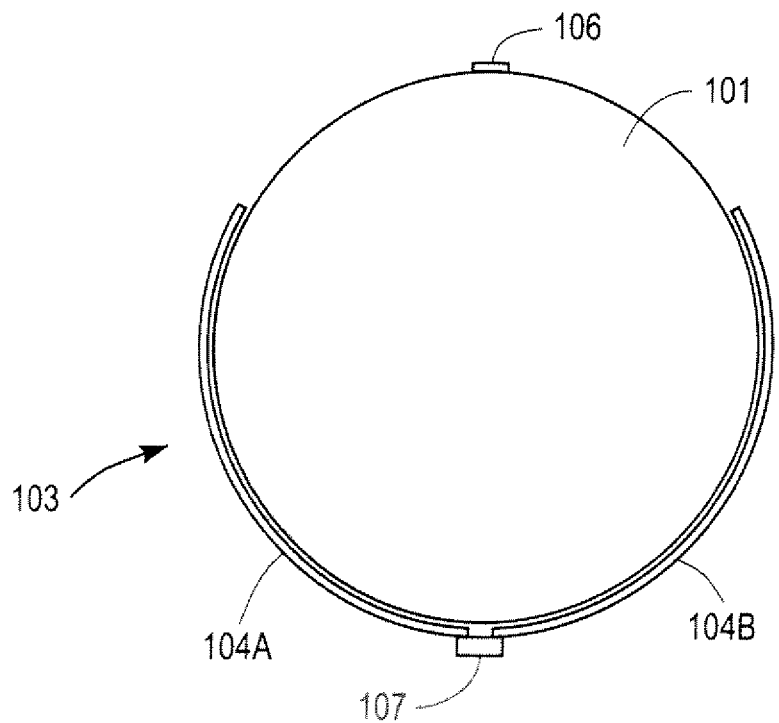
FIG. 6B shows a cross-sectional view of the core of FIG. 6A, where the cross-sectional view is taken through line 6B-6B shown in FIG. 6A.

Golf balls which have a single tag such as the ball shown in FIG. 3A may require more effort to find when the orientation of the antenna relative to the handheld transmitting/receiving device is such that most of the radiation transmitted from the handheld transmitting/receiving device is not received by the antenna. This can happen, for example, when the ball lands in an orientation in which most of the surface area of the antenna pattern is perpendicular to the plane of the transmitting antenna on the handheld transmitting/receiving device. In this case, very little if any electromagnetic energy is re-radiated back to the handheld device from the golf ball. The embodiments shown in FIGS. 6A, 6B, 6C, and 6D provide a golf ball which has greater detectability over a wider range of orientations relative to the handheld transmitting/receiving device. This greater detectability results from the substantially spherical coverage of the two independent tags which are arranged in a substantially orthogonal manner relative to each other. This can be seen from FIG. 6A, FIG. 6C, and FIG. 6D. The substantially orthogonal arrangement of the two independent tags each having an antenna pattern such as a radial transmission line antenna pattern provides for an adequate amount of surface area of the antenna (which non-perpendicularly faces the transmitting/receiving device) regardless of the orientation of the ball. FIG. 6A shows a top perspective view of a golf ball core 100 which includes two electrically independent tags 102 and 103, each of which includes a diode such as diode 106 or diode 107 and an antenna. In particular, tag 102 includes a diode 106 which is coupled in series between antenna portions 105A and 105B. The antenna portions 105A and 105B are each formed as a radial transmission line; for example, the antenna portions 105A and 105B may be formed in one of the patterns shown in FIGS. 8A-8G. The tag 103 includes antenna portions 104A and 104B and a diode 107 which is coupled in series between the antenna portions 104A and 104B. The tags 102 and 103 are disposed on a spherical surface of a core 101; it will be appreciated that alternatively, these tags may be disposed on a spherical layer which surrounds a core material. FIG. 6B shows a cross-sectional view of the core 100, where this cross-sectional view is taken at line 6B-6B as shown in FIG. 6A. The view of FIG. 6B shows the diode 107 coupled in series between the antenna portions 104A and 104B. It will be appreciated that the diode 107 is underneath the view shown in FIG. 6A.

The substantial orthogonality of tags 102 and 103 can be seen by noting the angle of intersection between the axes 110 and 111. This intersection is substantially a right angle (90°). The axis 110 represents the major axis formed by antenna portions 105A and 105B. Similarly, the axis 111 represents the major axis formed by antenna portions 104A and 104B. While the example shown in FIG. 6A shows the two tags arranged in an orthogonal orientation, it will be appreciated that slight deviations from perfect orthogonality may be used in certain embodiments; for example, a deviation of approximately about 10° to about 20° from a perfect 90° angle may still achieve desirable results and still be substantially orthogonal.

Figure 6C:
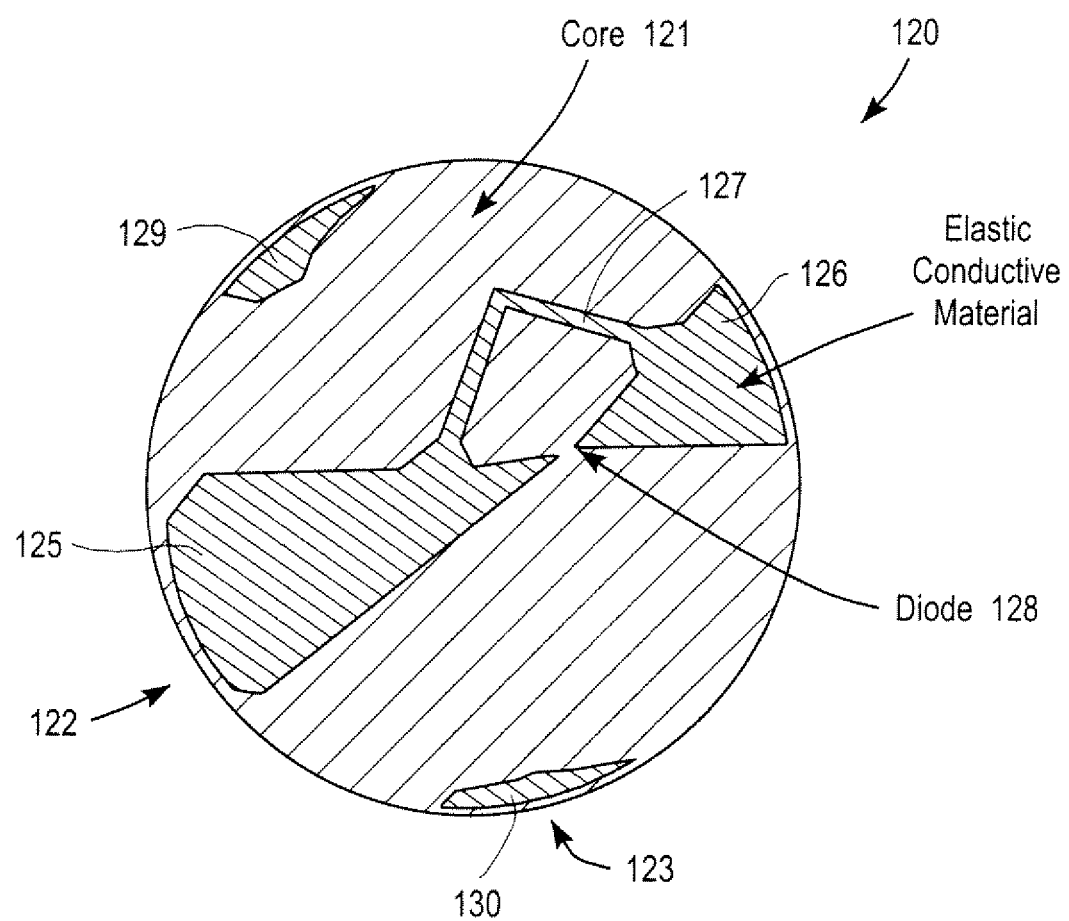
FIG. 6C is a side perspective view of a core of a golf ball which includes two tags, each of which have a pair of radial transmission lines to form an antenna pattern for each tag.

FIG. 6C shows a side perspective view of a golf ball 120 prior to the completion of the fabrication of the golf ball. In particular, a core 121 is shown with two tags 122 and 123 disposed on the outer spherical surface of the core 121. Each tag includes an antenna portion made out of an elastic conductive material and a diode, such as diode 128. Further, each tag includes an inductive element, such as inductive element 127 which is part of the tag 122. The tag 122 includes antenna portions 125 and 126 which are shaped as radial transmission lines such as the radial transmission lines shown in FIGS. 8A-8G. Similarly, the antenna portions 130 and 129 of the tag 123 are shaped as radial transmission lines. It can be seen from FIG. 6C that the tags 122 and 123 are arranged in a substantially orthogonal orientation relative to each other.

Figure 6D:
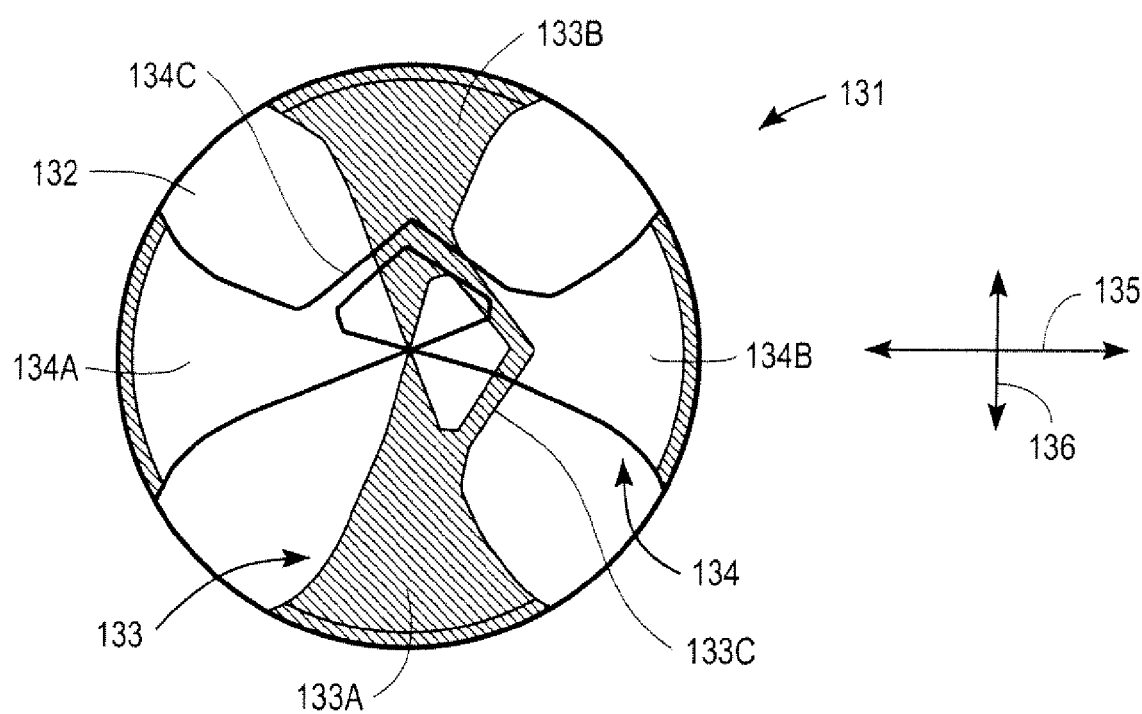
FIG. 6D is a view through a transparent core showing the orthogonal arrangement of the two tags relative to each other.

FIG. 6D shows a view of two tags disposed on the transparent core such that the two tags may be seen from the top perspective view shown in FIG. 6D. The portion of the golf ball 131 includes a core material 132 onto which are deposited an antenna material to form the antenna portions of tags 133 and 134. Each tag includes an antenna and a diode coupled in series between the two antenna portions which form the antenna. Each tag further includes an inductive element. In particular, tag 133 includes antenna portions 133A and 133B which are coupled in series with a diode (not shown) and also includes an inductive element 133C which is coupled between the two antenna portions 133A and 133B. This tag 133 is shown at the bottom of the transparent core material 132. Tag 134 includes antenna portions 134A and 134B and a diode (not shown) which is coupled in series between antenna portions 134A and 134B. The tag 134 further includes an inductive element 134C which is coupled between the antenna portions 134A and 134B. The tag 134 is shown on the upper surface (facing the viewer) of the core material 132. It can be seen that the tags 133 and 134 are substantially orthogonally arranged relative to each other by observing the axes 135 and 136. Axis 135 represents the major axis of tag 134 and axis 136 represents the major axis of tag 133. These axes intersect at a right angle as shown in FIG. 6D. Thus, the two tags 133 and 134 are arranged substantially orthogonally relative to each other around the spherical surface of the core material 132. It can be seen from FIG. 6D that the antenna pattern for each of the antenna portions is arranged as a radial transmission line which may take one of any of the patterns shown in FIGS. 8A-8G.

Figure 6E:
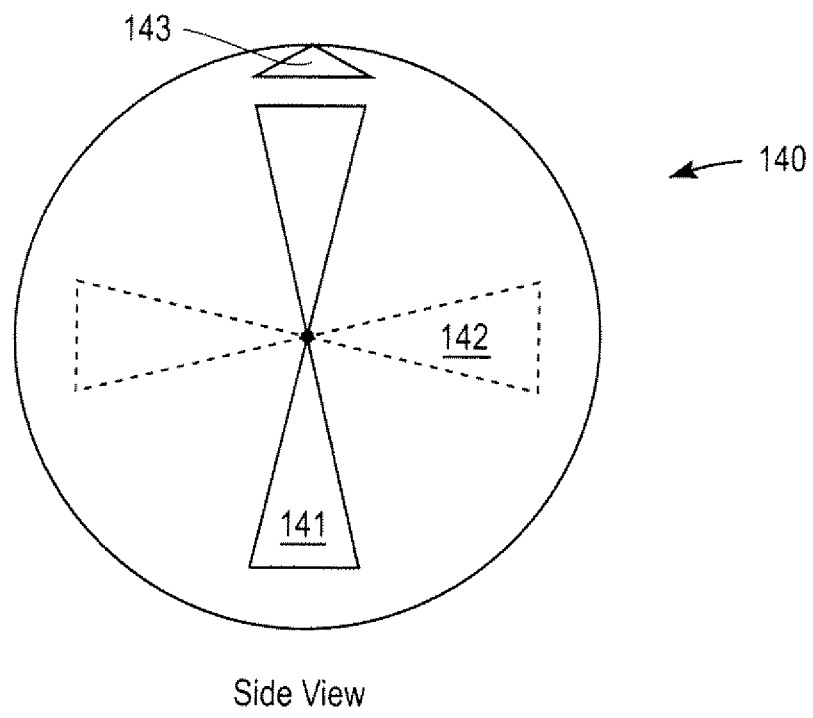
FIG. 6E shows a side view of a golf ball core with three orthogonal tags, each of which has a pair of radial transmission lines to form an antenna pattern for each tag.
Figure 6F:
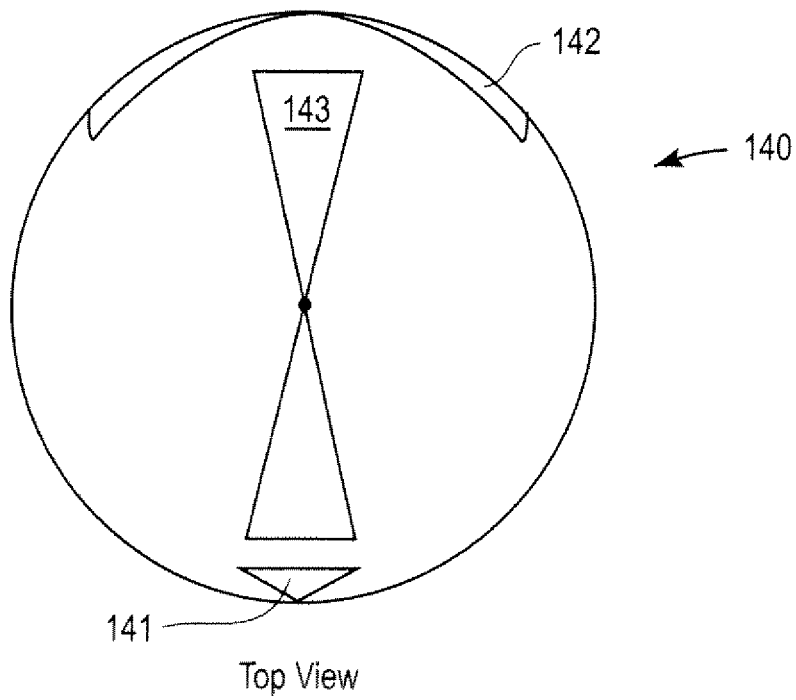
FIG. 6F shows a top view of the golf ball shown in FIG. 6E.

FIGS. 6E and 6F respectively show a side view and a top view of a core 140 (or core and mantle layer) of a golf ball where the ball includes three substantially orthogonal tags on the core (or on the mantle layer). The three substantially orthogonal tags 141, 142 and 143 are arranged so that their 3 main axes are perpendicular to each other. This may be done by arranging the 3 main axes of the 3 tags to be parallel with a virtual x,y,z rectilinear coordinate system such that, in the view of FIG. 6E, the main axis of tag 142 is parallel with the x axis of this coordinate system, the main axis of tag 141 is parallel with the y axis of this coordinate system, and the main axis of tag 143 is parallel with the z axis of this coordinate system. These 3 substantially orthogonal tags provide for substantially spherical coverage. In the case of a golf ball with three tags, the limited space on the ball may restrict the size of each antenna which may in turn restrict the operating frequency range of the antenna (e.g. the tags 141, 142 and 143 may function at an excitation frequency such as 2400 MHz, which may be available in, for example, Australia, Europe and other countries). Each of the tags 141, 142 and 143 may be implemented as a circuit shown in FIG. 2A and may use radial transmission lines as antenna portions, and these antenna portions may be formed, at least in part, from an elastic conductive material such as an elastic conductive ink.

While the embodiments shown in FIGS. 6A-6F show the use of two or more functional tags, it is possible in certain alternative embodiments to use a single functional tag (e.g. as in FIG. 3A) in combination with another non-functional (dummy) tag which does not operate to indicate the presence of the ball. This may be done to achieve improved symmetry and lower cost (since a functioning diode is not required to be used for the dummy tag). The improved symmetry may be obtained by using materials for the dummy tag which substantially or approximately match the weight and density/specific gravity of the components of the functional tag such that the ball maintains its symmetry.

Figure 7A:
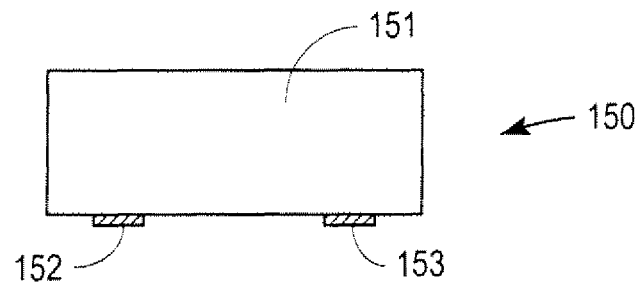
FIG. 7A is a side view of a leadless diode.
Figure 7B:
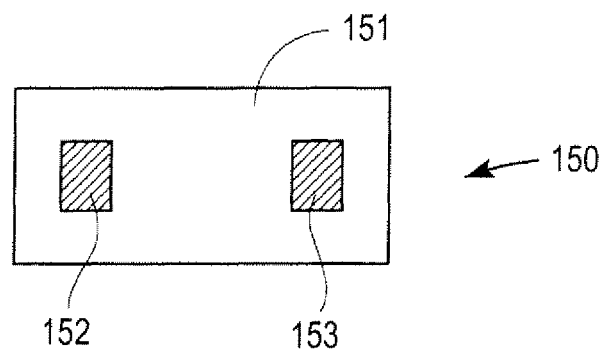
FIG. 7B is a bottom view of the leadless diode of FIG. 7A.
Figure 7C:
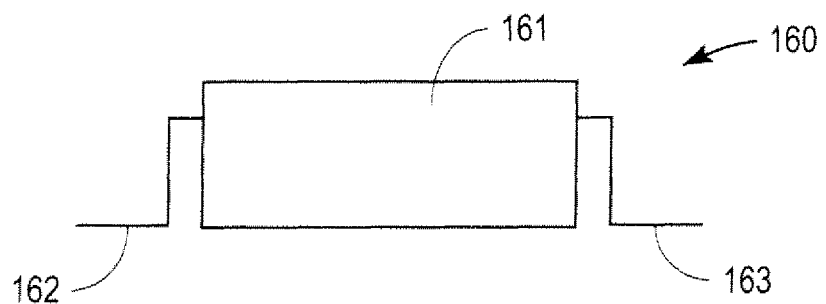
FIG. 7C is a side view of a diode which includes leads.

An electrical component is typically used to make various tags described herein. One such electrical component is a diode shown in the electrical schematic of FIG. 2A. Alternatively, a transistor or other types of components (e.g. an RFID integrated circuit) may be utilized. The electrical component is typically housed in a package which encases the component to protect it from the environment. FIGS. 7A-7C show two examples of the packaging for a diode. It will be appreciated that other types of packaging (e.g. a low profile package) may alternatively be used. The diode 150 shown in FIGS. 7A and 7B includes a package 151 with two electrical contact pads 152 and 153. This particular package may be considered a leadless package. The contact pads 152 and 153 may be coupled directly to corresponding antenna portions such as the manner shown in FIG. 4B where the pad 86A and the pad 86B of FIG. 4B correspond to pads 152 and 153 of FIGS. 7A and 7B. The connection between the antenna portions and the corresponding contact pad on the diode may be made by a compressible, elastic conductive adhesive or by an elastic conductive ink which is painted onto the pad on the antenna portion. The diode 150 may be disposed within a void as shown in FIG. 4B or may be disposed on top of a surface (without a void) such as in FIG. 6B. The contact pads may face away from the center of the golf ball core, such as in the case of FIG. 4B, or may face toward the golf ball core, as in the case of FIG. 6B. It will also be appreciated that the end portions of the antenna portions may extend into the void, such as void 83, and the contact pads of the diode may face toward the center of the core and contact the antenna portions within the bottom portion of the void. FIG. 7C shows an alternative diode package which includes leads 162 and 163 which extend outwardly from the package 161. This diode 160 may be used in various embodiments described herein rather than the leadless diode 150 shown in FIGS. 7A and 7B.

Figure 8C:
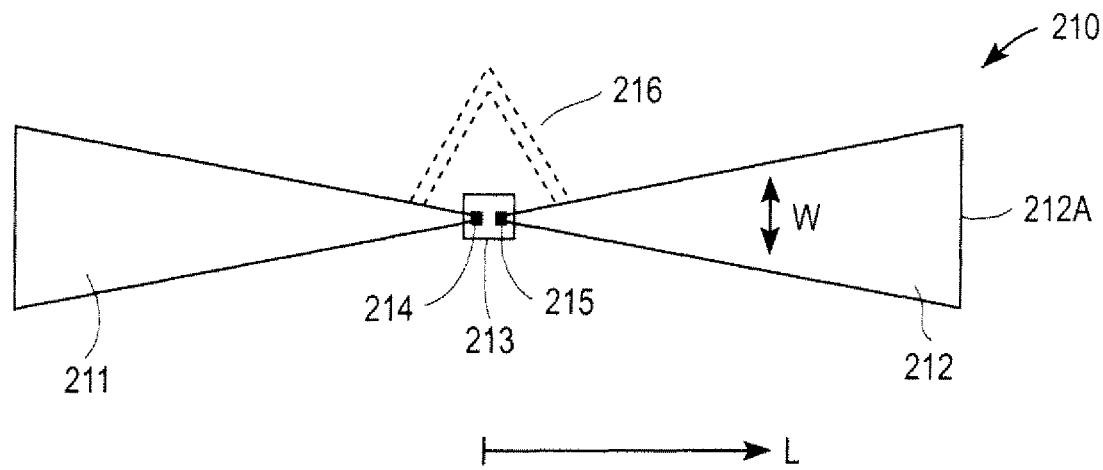
FIG. 8C shows a plane view of another embodiment of a tag having an antenna pattern formed from radial transmission lines.

FIGS. 8A-8G show examples of tags which have antennas that are patterned such that each antenna portion is a radial transmission line. At least the antennas shown in FIGS. 8A, 8B, 8C, 8D, 8F and 8G may be formed from an elastic conductive material (such as a conductive ink) which is applied as a liquid and then dried or is applied in other ways. FIGS. 8A and 8B show an antenna and a portion of an antenna, respectively, with an inductive element. In particular, an antenna 200 is shown as having two antenna portions 201 and 202 which are separated by a gap 204 and which are coupled by an inductive element 203. The gap is for the placement of a diode or other electrical component which couples together the antenna portions. For example, in the case of a diode such as in the circuit of FIG. 2A, the diode is coupled between the antenna portions 201 and 202 to produce the circuit shown in FIG. 2A, where the inductive element 203 corresponds to the inductor 58 in FIG. 2A and the antenna portions 201 and 202 correspond to the portions 52 and 54. FIG. 8A indicates exemplary measurements of a particular antenna where the lengths are given in inches and the angular measurements are given in degrees. FIG. 8B shows a portion of the antenna 200 with further dimensions being shown. It will be appreciated that the optimum or nearly optimum dimensions of the antenna are a function of the electrical properties of the core material (and/or other materials) of the particular ball. Thus, a method of one embodiment of the invention may design a golf ball by determining the electrical properties of the materials of the ball and displaying the parameters (e.g. antenna dimensions and/or diode parameters) of the electrical components to achieve optimum or near optimum performance.

FIG. 8C shows another example of a tag with a different antenna pattern than that shown in FIG. 8A. The tag 210, as shown, does not include an optional inductive element, which may be added as inductive element 216 in the manner illustrated in FIG. 8C. The tag 210 includes a diode 213 having contact pads 214 and 215 which make contact with respective antenna portions 211 and 212. Each antenna portion 211 and 212 is patterned as a radial transmission line which may be defined as a pattern which has a width W which changes either linearly or exponentially with respect to a length L. This can be seen in FIG. 8C where the length may be measured from a position at the center of the diode. As the length increases from zero (near the center of the diode) to a maximum length at the end 212A of the antenna portion 212, the width increases linearly with increases in length. In other words, the width is a linear function of the length in the case of the embodiment shown in FIG. 8C. Alternatively, the width measured through a cross-section which is perpendicular to a main axis of the antenna portion may increase exponentially relative to the length; in other words, the width is an exponential function of the length, measured from the smallest width to the largest width.

Figure 8D:
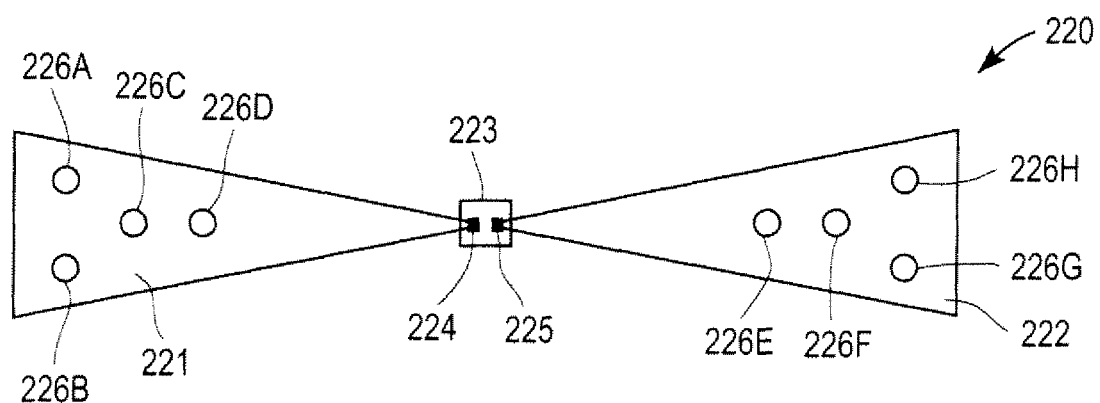
FIG. 8D shows an example of another tag having an antenna formed with radial transmission lines, wherein the antenna includes perforations in the antenna.

FIG. 8D shows an example of a tag 220 having antenna portions 221 and 222 which are patterned as radial transmission lines and which optionally include perforations 226A-226H. The tag 220 also includes a diode 223 which has electrical contact pads 224 and 225 which are coupled to their respective antenna portions as shown in FIG. 8D. This tag 220 does not include an inductor, which may be acceptable in certain implementations. The perforations 226A-226H exist from one side of the antenna to the other side of the antenna, allowing for the material below the antenna to contact and mix with the material above the antenna during the fabrication process of making the golf ball. This tends to improve the integrity of the golf ball, thereby increasing its durability. These perforations may be regularly spaced or irregularly spaced on the antenna portions. These perforations allow for the underlying material to extrude through the perforations during the manufacturing process and/or allow the overlying material to extend into and through the perforations during the manufacturing process. Examples of other tags having perforations in the antenna patterns are shown in FIGS. 8E, 8F, and 8G.

Figure 8E:
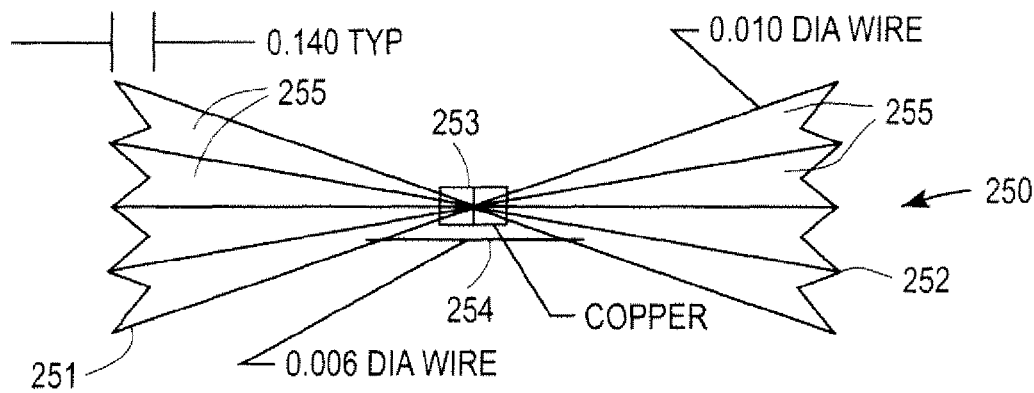
FIGS. 8E, 8F, and 8G illustrate alternative embodiments of antennas having a pattern resembling a radial transmission line with perforations in the antenna pattern.

FIG. 8E shows, in plane view, a tag 250 having two antenna portions 251 and 252, each of which are formed in the pattern of a radial transmission line. The pattern is formed by a mesh of fine wires which are interconnected electrically to form the structure which is shown. The fine wires may be arranged in a zig-zag manner (rather than a purely straight line) or they may include elastic conductive ink to provide improved durability. Perforations 255 exist between the wires as shown in FIG. 8E. A diode 253 is coupled in series between the antenna portions 251 and 252. The tag 250 also includes an inductive element 254 which is a wire which is coupled between the antenna portions 251 and 252 as shown in FIG. 8E. The measurements shown in FIG. 8E are in inches. In this particular embodiment, the tag 250 is approximately 2.8 inches long (from left side to right side) and approximately 1 inch wide, from top to bottom, at the end of an antenna portion.

Figure 8F:
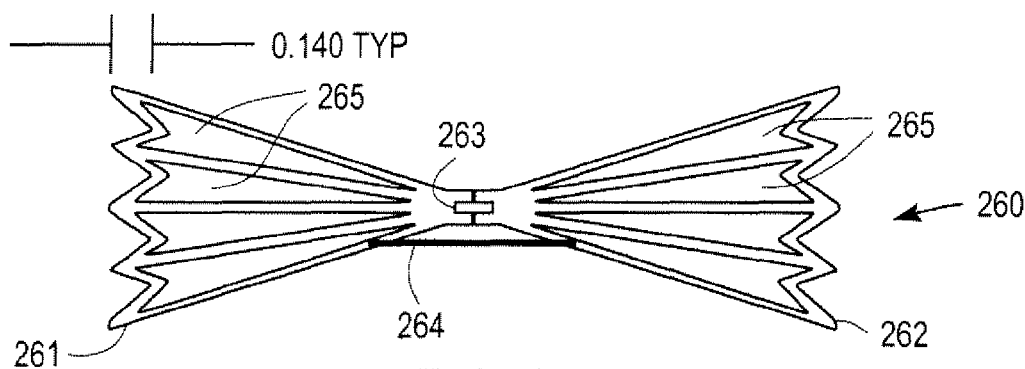

FIG. 8F shows a tag 260 in plane view. The tag 260 includes a left antenna portion 261 and a right antenna portion 262. These antenna portions are coupled to a diode 263 to form a circuit such as that shown in FIG. 2A. An inductive element 264 is also included in the tag 260 and corresponds to the inductor 58 in the circuit of FIG. 2A. The conductive part of the antenna portions 261 and 262 may be formed from wire or from a patterned or created antenna structure formed out of an elastic conductive material, such as a conductive ink. The antenna portions 261 and 262 include perforations 265 which provide some of the same advantages that perforations 226A-226H provide in the case of the tag 220.

Figure 8G:
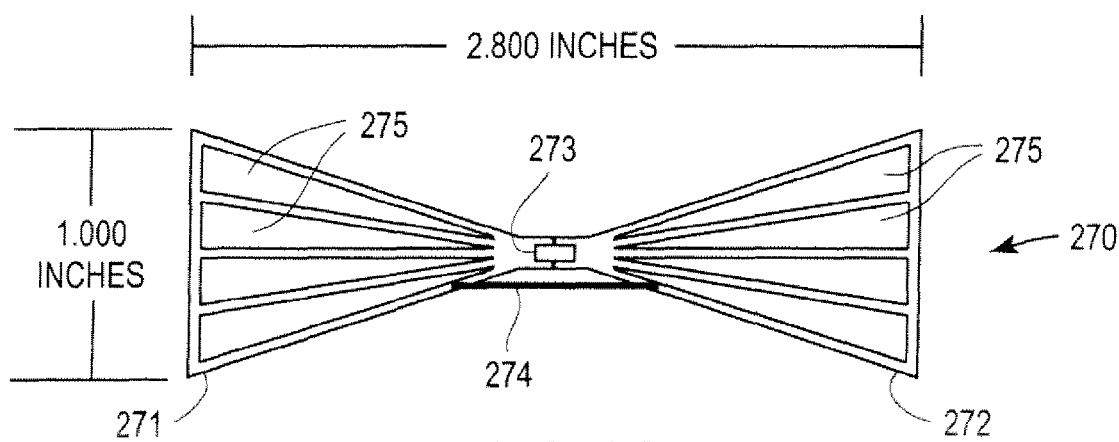

FIG. 8G shows an example of another tag which has perforations and which may be formed from a wire or from a patterning of an elastic conductive material. The tag 270 includes an antenna portion 271 and an antenna portion 272, with a diode 273 coupled in series with the antenna portions. The tag 270 also includes an inductive element 274 which is coupled between the antenna portions 271 and 272 as shown in FIG. 8G. The tag 270 includes perforations 275 which are between the wires or legs of each antenna portion. The antenna portions may be formed from wire or from a patterning of an elastic conductive material. The dimensions shown in FIG. 8G are for one exemplary tag and it will be appreciated that other sizes may be used.

While many of the embodiments of tags described herein use an antenna having portions which are patterned in the form of radial transmission lines, it will be appreciated that alternative embodiments of tags, for use in golf balls, may use antennas having different patterns such as a folded dipole pattern or other patterns (e.g. see the antennas in FIGS. 1 and 2 of published European Patent Application EP1035418A1), which different patterns do not include radial transmission lines. Antennas which are not patterned with radial transmission lines may be configured to be substantially orthogonal such that the major axes of the antennas are substantially perpendicular. Antennas which do not include radial transmission lines may be formed from an elastic conductive material (e.g. an elastic conductive ink), and they may be coupled to diodes which are disposed at least partially in voids, and they may be manufactured using any one of the techniques described herein (e.g. painting or spraying or ink jetting or the use of a template for manual painting, etc.).

Certain embodiments of the tags shown in FIGS. 8A-8G may be designed so that the antenna of the tag has two radial transmission lines with a natural resonant frequency between an excitation frequency from a transmitting/receiving device (e.g. handheld unit 14), which is designed to find the ball containing the tag, and a harmonic (e.g. second harmonic which is twice the excitation frequency) of the excitation frequency. These certain embodiments may be further designed such that an impedance of the diode, which is coupled between the two radial transmission lines of the antenna, is substantially tuned to an impedance of the antenna at both the excitation frequency (e.g. 915 MHz) and the re-radiated frequency (e.g. 1830 MHz) of the signal returned by the tag. The use of radial transmission lines in the antenna will tend to ease tolerance parameters for the diode (relative to tolerance parameters for a diode used with a non-radial transmission line antenna); for example, tolerance range of a diode's capacitance may be enlarged by using an antenna with radial transmission lines.

Methods of manufacturing golf balls, such as those described herein, will now be set forth. The various golf balls described herein, such as the golf ball shown in FIGS. 3A-6F, may be constructed in a manner such that they comply with the golf ball specifications of the U.S. Golf Association or of the Royal and Ancient Golf Club of St. Andrews. For example, the weight of the golf ball with the tag will not exceed 45.927 grams (total ball and tag weight). The size and shape of the golf ball as shown in, for example, FIG. 3A, is within the specifications for a golf ball of the USGA (United States Golf Association) or the Royal and Ancient Golf Club of St. Andrews, and thus the weight and size of such golf ball complies with the specifications. Furthermore, it has been determined that golf balls having the various tags described herein, such as the golf ball shown in FIG. 3A, have sufficient durability to comply with the durability standards of the golf ball manufacturing industry (e.g. the balls survive 40 cannon test hits). For example, a golf ball and tag of the form constructed in the manner shown in FIG. 3A will normally survive many cannon hits which is the conventional way of testing the durability of golf balls. Most of the golf balls and tags designed according to the embodiments described herein will survive at least 20 cannon hits and many (e.g. more than 50%) such golf balls survive 40 or more cannon hits, which is considered to be the desired goal for durability of golf balls. High durability, in one minimum requirements embodiment, of both the tag(s) and the golf ball may be considered to be achieved when most (e.g. more than 50%) of the balls in a sample of balls survive 20 standard cannon test hits and most of the balls are still detectable (e.g. findable) over a range of at least 20 feet after the 20 standard cannon test hits. High durability, in another embodiment, of both the tag(s) and the golf ball may be considered to be achieved when most (e.g. more than 50%) of the balls in a sample of balls survive 40 standard cannon test hits and most of the balls are still detectable (e.g. findable with a handheld transmitting/receiving unit such as unit 14) over a range of at least 20 feet (between the transmitting/receiving unit and the ball) after the 40 standard cannon test hits. Having extra tags within a ball (e.g. a second or third tag) will improve the likelihood that the ball will be detectable over a range of at least 20 feet after 20 or 40 cannon hits because if one tag fails after a certain number of hits, other tags within the ball will probably continue to function and the ball is still findable (especially if golfers use a technique, described below, which includes rotating the transmitting/receiving device). Furthermore, the flight characteristics (e.g. initial velocity) of the golf balls described herein substantially comply with the flight characteristics of golf balls specified by the U.S. Golf Association or the Royal and Ancient Golf Club of St. Andrews. Thus the overall distance the ball travels with normal hits, its initial velocities and other parameters normally specified in the requirements of the USGA or the Royal and Ancient Golf Club of St. Andrews under their standard testing procedure can be satisfied by the golf balls fabricated as described in the various embodiments herein.

Figure 9A:
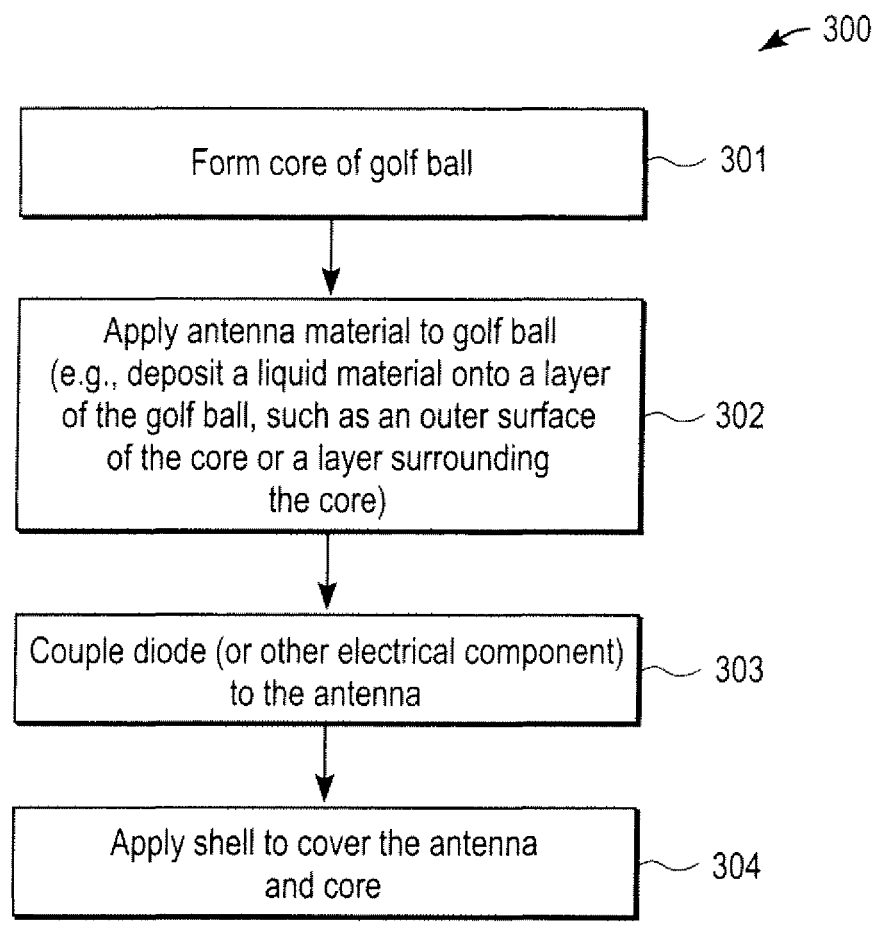
FIG. 9A is a flowchart which illustrates one method of making a golf ball.

FIG. 9A shows a method 300 which is one method of forming at least some of the embodiments of the golf balls described herein. Operation 301 involves the formation of the core of the golf ball. This core may be formed in a variety of conventional ways using conventional compositions such as, for example, those described in U.S. Pat. Nos. 5,508,350 and 4,955,613. Typically, a cylindrically shaped slug which is a rubber composition which has not been vulcanized is placed in a mold to form a spherical core. An example of such a mold is shown in FIG. 10. The unvulcanized rubber in the cylindrically shaped slug is molded in a high temperature and high pressure operation. This molding operation, due to the high temperature and high pressure, vulcanizes and cures the rubber composition. In one exemplary embodiment, the core rubber composition is vulcanized/cured for 8 minutes at a temperature of about 325° F. under a high pressure clamping of about 2 tons per square inch. After the molding process, the core is allowed to cool overnight at room temperature and then the surface is cleaned prior to further processing, such as operation 302. In operation 302, an antenna material is applied to the golf ball. In one exemplary embodiment, a liquid material is deposited onto a layer of the golf ball such as the outer surface of the core. In the case of a three or more piece golf ball in which the antenna is applied over a layer which surrounds the core, such layer would typically be deposited around the core before depositing the liquid material onto the layer. One way of depositing this layer around the core involves injection molding of this layer around the core. The liquid may be deposited in a number of ways such as manual painting, or spraying, or ink jetting, etc. The liquid material may be an elastic conductive material which, when dried, is both elastic and conductive. In operation 303, a diode or other electrical component is coupled to the antenna to form a tag. Then in operation 304, a shell material is applied to cover the antenna and the core. The shell material may be any of the known examples of suitable cover materials, including, for example, the materials which are described in U.S. Pat. No. 5,538,794. The material may be applied in an injection molding process using conventional injection molding techniques. It will be appreciated that the positioning of one or more diodes in the voids described herein may avoid certain problems which occur in the injection molding process in which the cover material is injection molded over the antenna structure; for example, the diode may be prevented from moving in the injection molding process despite the high velocity injection of the cover material into the mold. Alternatively, a compression molding method may be used to construct the layers outside of the tag, such as a shell layer. A compression molding operation is less likely to dislodge or move a diode or other component from the tag structure during the molding operation.

After encasing the core and tag into a shell, the ball may be processed in finishing operations, which are conventional, and which include ball trimming, surface cleaning, stamping/logo application and painting. As noted elsewhere, embodiments of the invention may be used in golf balls constructed as one-piece balls or two-piece balls or balls which have more than two pieces.

Figure 9B:
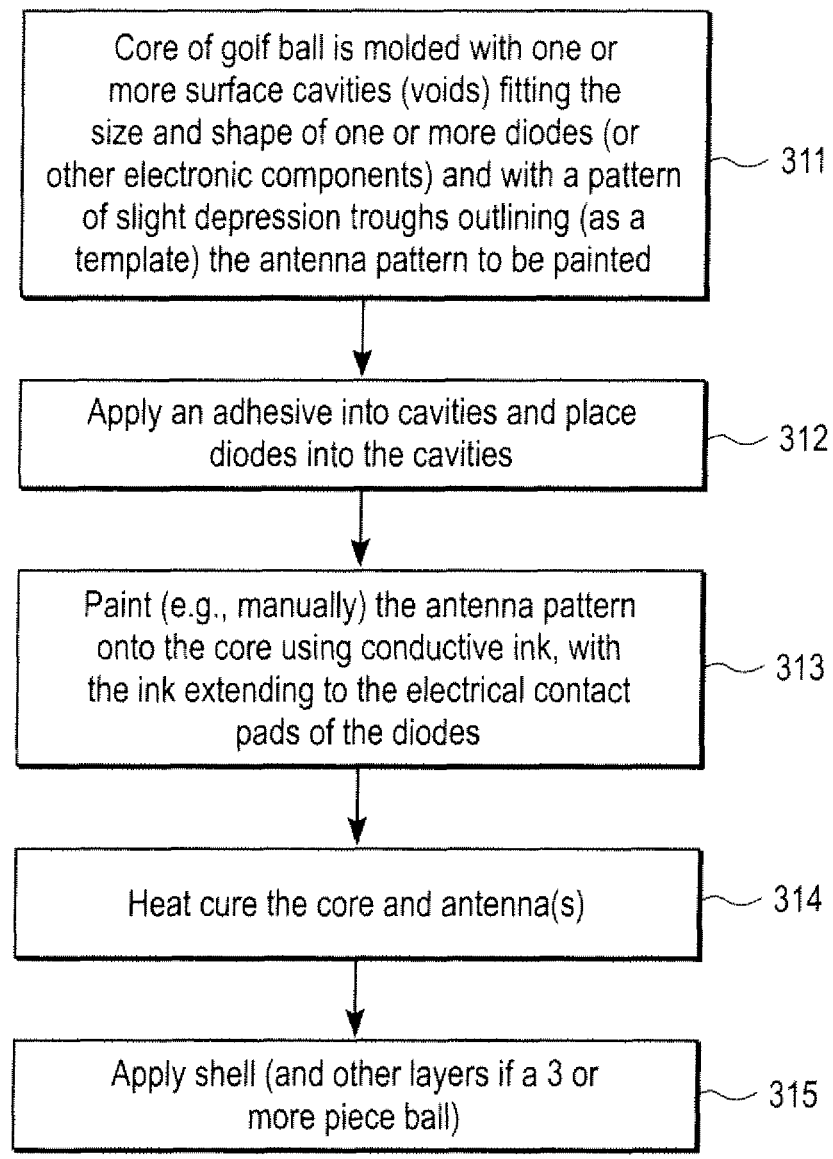
FIG. 9B is a flowchart which illustrates another method of making a golf ball.

FIG. 9B shows an example of another method which may be used to make certain embodiments of the golf balls described herein. In operation 311, the core of a golf ball is molded with one or more surface cavities, such as a void 83 shown in FIGS. 4A and 4B. The surface cavity fits the size and shape of one or more diodes or other electrical components. The core is also molded with a pattern of a slight depression which provides a template, allowing the antenna pattern to be painted. An example of such slight depression troughs which outline a pattern are shown in FIGS. 5A and 5B. It will be appreciated that the voids and the troughs may be formed in a layer which surrounds the core rather than the core itself, such as the layer 39 shown in FIG. 3A. In operation 312, an adhesive is optionally applied into the cavities and then the diodes or other electronic components are placed into the cavities. The adhesive secures the diodes or other electrical components into the cavities. An example of this adhesive is shown in FIG. 4B, wherein the adhesive 87 secures the diode 84 into the cavity 83 of a core material 82. Then in operation 313 the antenna pattern is painted onto the core using conductive ink, with the ink extending to the electrical contact pads of the diodes. This results in the structure shown in FIG. 4B and FIG. 4C. The antenna pattern may be painted manually by a person with a paintbrush painting the conductive ink within the outline defined by the depression troughs. Then in operation 314, the core and the antenna structure is heat cured for a period of time sufficient to cure the antenna. In the case of the antenna material which is based on Electrodag PF-046, the structure may be cured for a minimum of about 5 minutes at about 121° C. Then in operation 315 a shell is applied to encase the antenna and core. In those embodiments in which the golf ball is a three or more piece golf ball, other layers are applied before the outer shell is applied. These layers and the shell layer may be applied using conventional techniques, such as injection molding or compression molding described above. In the case of a three or more piece golf ball, the one or more tags may be placed between a mantle layer and the shell rather than directly on the core.

Figure 9C:
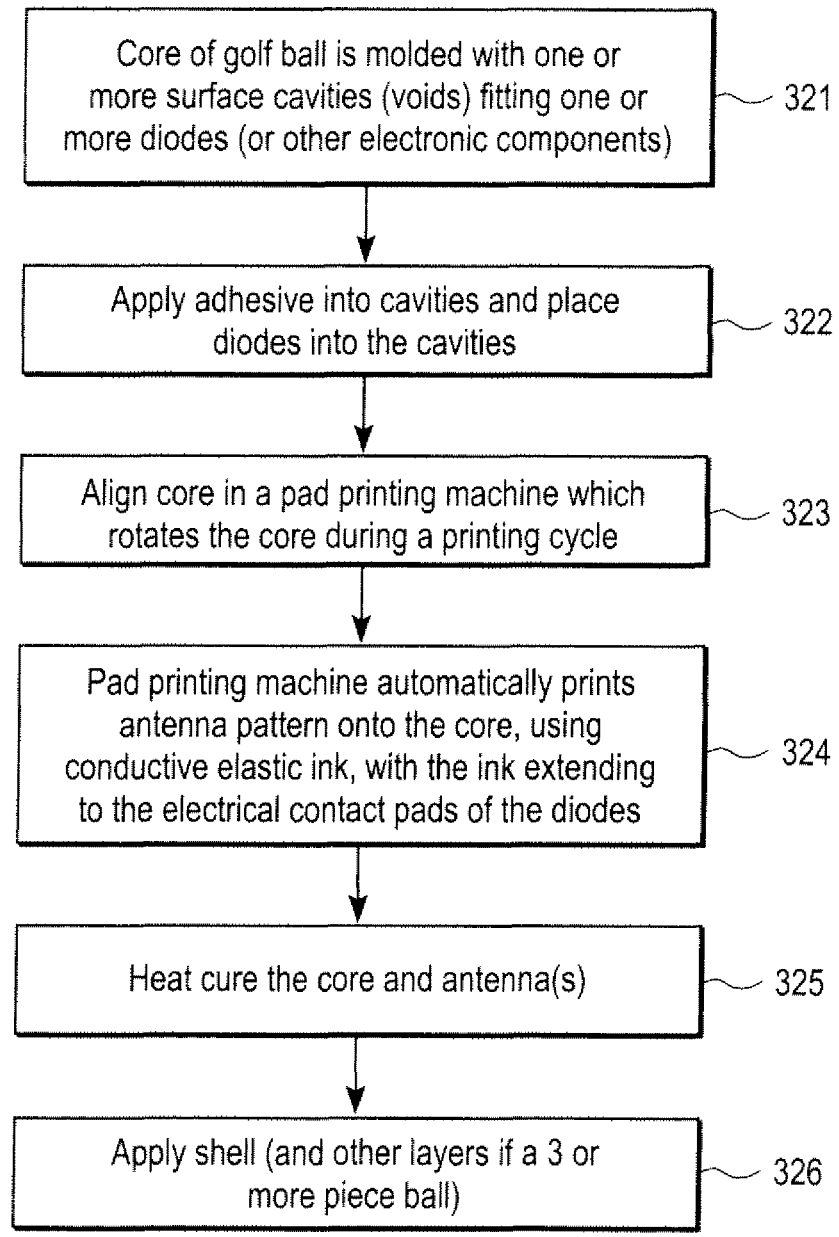
FIG. 9C shows a flowchart which illustrates another method of making a golf ball.

FIG. 9C illustrates an example of another method for making a golf ball which may be used to make certain of the embodiments described herein. Operation 321 shown in FIG. 9C involves the formation of the core of a golf ball with one or more surface cavities which are designed to fit one or more electronic components, such as diodes. This core may be formed using a mold such as that shown in FIG. 10 to provide the voids or cavities in the core which are designed to receive electrical components such as diodes. An example of such a void is shown as void 83 in FIG. 4A. In operation 322 an adhesive is optionally applied into the cavities and the diodes or other electrical components are placed into the cavities to secure the diodes in the cavities. An example of the use of such adhesive is shown in FIG. 4B. Then in operation 323, the core is aligned in a pad printing machine which rotates the core during a printing cycle. An example of such machines include the COMEC Inkprint LPE 60 pad printing machine from Pad Printing Machinery of Vermont, incorporated in Manchester, Vt. The pad printing machine in operation 324 automatically prints the antenna pattern onto the core using a conductive elastic ink, with the ink extending to the electrical contact pads of the diodes. This will form the structure shown, for example, in FIG. 4B and in FIG. 4C. Then in operation 325, the antenna pattern on the core is heat cured for a sufficient period of time to cure the antenna structure, thereby drying it while leaving it both elastic and conductive. In the case of the Electrodag PF-046 material, the antenna structure may be cured for about a minimum of 5 minutes at 121° C. Then in operation 326, conventional processing techniques may be used to apply a shell if the ball is a two-piece ball or other layers in addition to a shell if it is a three or more piece golf ball. The shell layer as well as the other layers may be applied using injection molding or compression molding and the materials used for these layers may be the same as those used for conventional, existing golf balls. An alternative process, based upon the method shown in FIG. 9C, involves inserting the diodes (with or without an adhesive) in the cavities after the pad printing operation; thus, the operation 322 follows operation 324. The diodes are then coupled to the antennas by painting or spraying or jetting elastic conductive ink to connect the leads of the diode to their respective antenna portions.

Figure 9D:
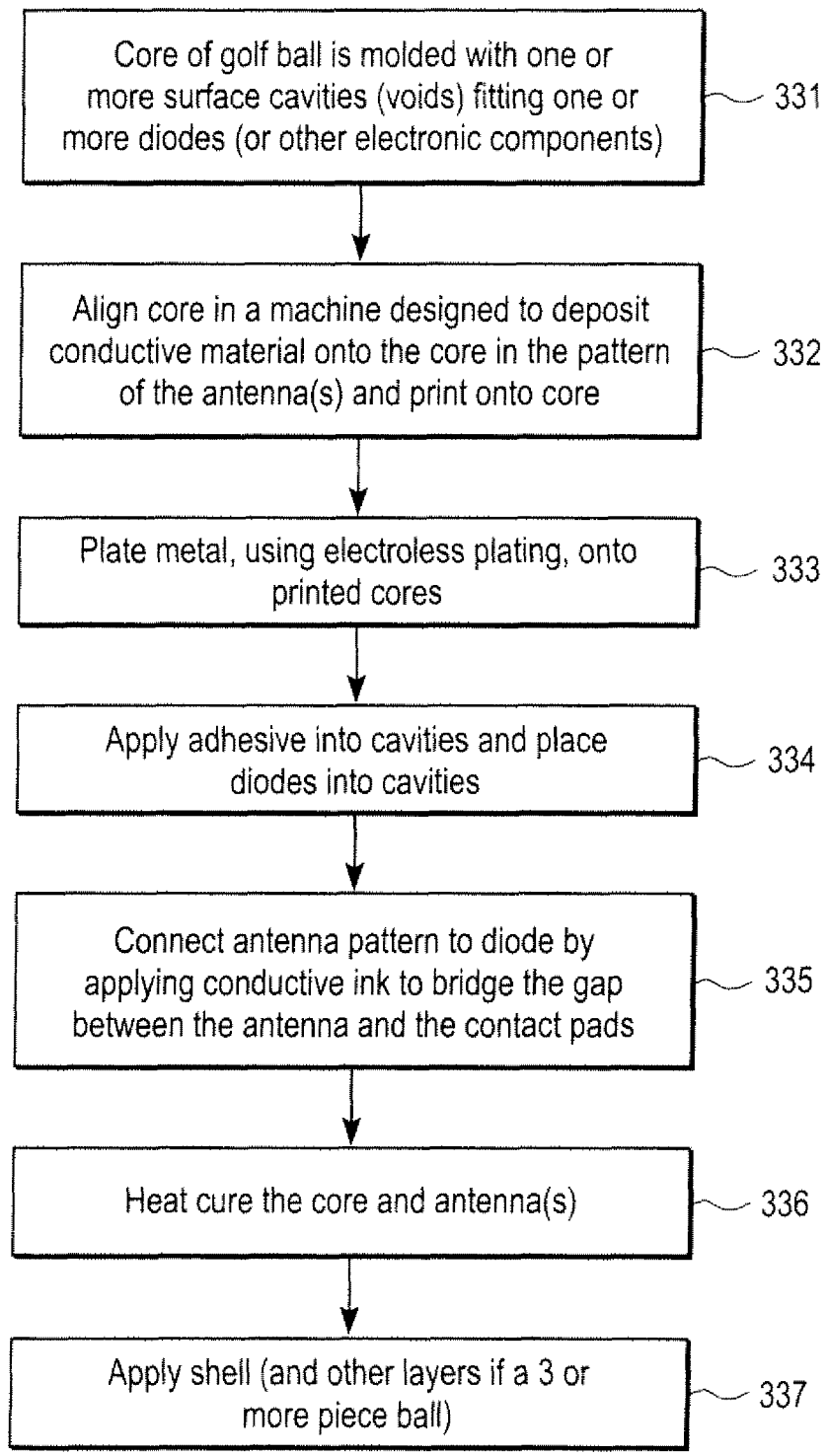
FIG. 9D is a flowchart which illustrates another method of making a golf ball.

FIG. 9D shows another example of methods for making certain embodiments of the golf balls described herein. Operation 331 is similar to operation 321 and results in the creation of a core having voids designed to receive diodes, such as the core 403 shown in FIG. 10. In operation 332, the core is aligned in a machine designed to deposit conductive material onto the core in the pattern of the antennas. The machine then prints a seed layer in the form of the antenna pattern or patterns onto the core. Rather than printing the seed layer onto the core, the seed layer may alternatively be sputtered or evaporated onto the core. Then in operation 333, metal is plated onto the printed (or otherwise patterned) cores using, in one exemplary embodiment, electroless plating. Following the plating operation, adhesive is optionally applied into the cavities and the diodes are placed into the cavities in operation 334. The diodes are electrically coupled to the antennas in operation 335 by applying elastic conductive ink to bridge the gaps between the antenna and the respective contact pads on the diodes. This can result in the structure shown in FIG. 4B. An additional operation may be included after metal has been plated in operation 333; this additional operation includes applying (e.g. painting) an elastic conductive ink over the plated metal of the antenna pattern. This improves the durability of the tag. Then the core and the antenna pattern is cured in a heat curing operation 336 which is similar to the heat curing operation 325 described above. Then in operation 337, the shell layer is applied to cover the core and the antenna structure in the case of a two-piece ball. In the case of a three or more piece ball, additional layers are applied before applying the shell layer using conventional techniques for fabricating golf balls.

Figure 9E:
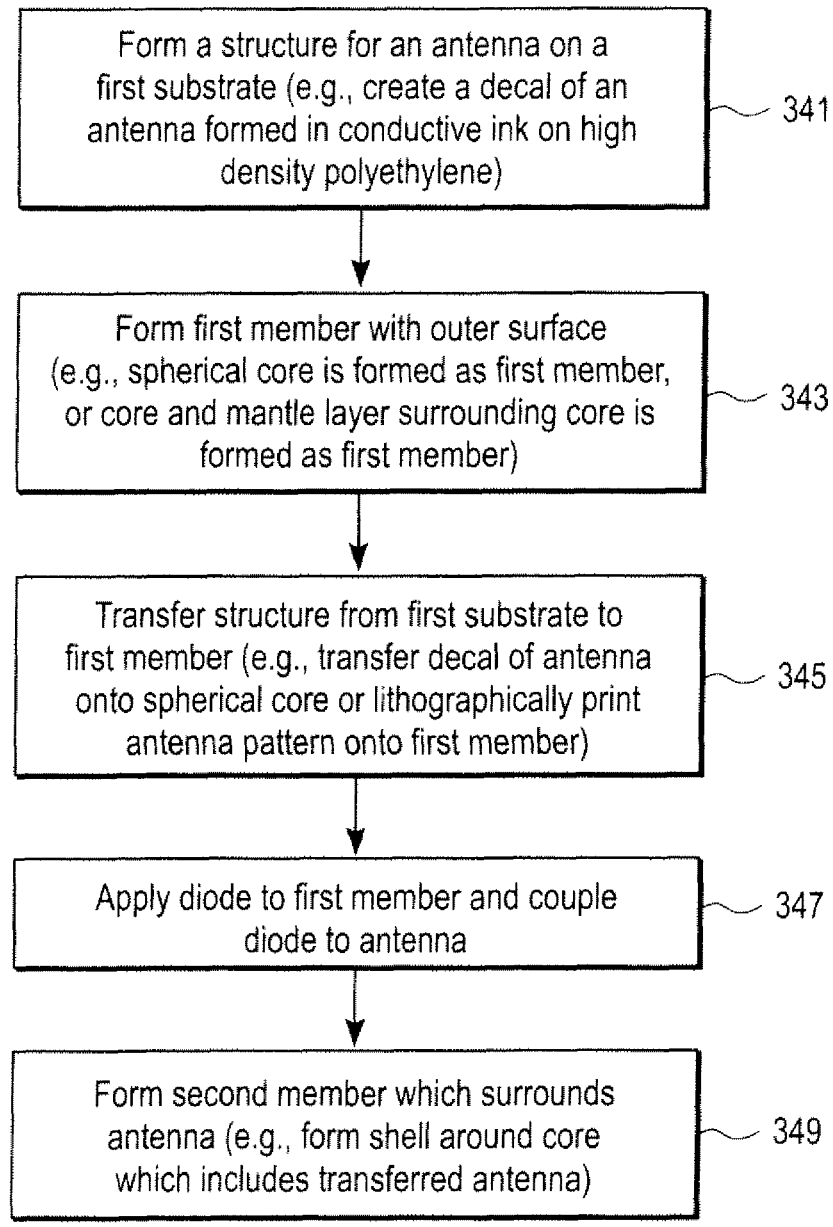
FIG. 9E is a flowchart which illustrates another method of making a golf ball.

FIG. 9E shows another example of methods for making certain embodiments of the golf balls described herein. The methods shown by FIG. 9E include decal transfers or transfer printing of an antenna structure from a temporary substrate (e.g. a first substrate) to a component of a golf ball which will remain a part of the finished golf ball. In operation 341, a structure for an antenna is formed on a first substrate; in one exemplary embodiment, this operation may involve printing or painting an elastic conductive ink, in a pattern which creates the antenna on a first member, onto a flexible first substrate which is formed from high density polyethylene (HDPE). Other materials may alternatively be used for the first substrate. After the antenna pattern is created on the HDPE, the first substrate resembles a decal which can be applied to another surface so that the antenna pattern can be created on that another surface. It will be appreciated that the pattern on the first substrate may not look like the final antenna on the first member because the pattern would normally be created on a flat, 2-dimensional surface (e.g. the HDPE's surface) and the first member may resemble a sphere (e.g. a core of a golf ball). Thus, a mapping of the pattern from a 2-dimensional to a spherical surface may be required. Such transformation is known in the art and may be used to design the proper appearance of the antenna pattern on the 2-dimensional surface of the HDPE. Such a transformation may not be required if the antenna pattern on the 2-dimensional surface of the HDPE covers only a small portion of the sphere's surface area. In operation 343, a first member with an outer surface is formed; this first member may be, in one embodiment, a spherical core of a golf ball or it may be a core and mantle layer where the outer surface of the mantle layer is a sphere. It will be appreciated that operation 343 may precede operation 341. In operation 345, the antenna structure is transferred from the first substrate to the first member. This operation may be accomplished in a number of ways. For example, the decal-like antenna pattern on the HDPE surface may be applied onto the first member while the ink is wet (as in a lithographic printing operation); alternatively, the antenna pattern and HDPE substrate may be wrapped around (or placed into contact with) the surface of the first member and remain on the surface for future processing operations. In the example where the ink is transferred while it is wet, the first substrate may be removed from the first member so that the first substrate is not in the finished ball. In the example where the first substrate is placed in contact with a surface of the first member, the first substrate may or may not remain in the finished ball, although if the first substrate is HDPE, the HDPE can remain and may be absorbed into the ball's materials upon a curing operation. After operation 345, one or more diodes may be applied to the first member and then coupled to the one or more antennas. In an alternative embodiment, the diode may be attached to the first substrate and transferred with the antenna's structure to the first member in operation 345; in this case, a diode may be coupled to its antenna before being transferred or after being transferred. Such a diode may be coupled to its antenna through a conductive ink which is elastic. After operation 347, a second member, such as a shell layer, is formed around the first member and surrounds the tag which was created on the first member.

It will be appreciated that the sequence of operations in FIGS. 9A-9E may be modified to follow alternative sequences.

FIG. 10 shows an example of a manufacturing technique for forming voids for electrical components and also for forming depression troughs on the core which can be used to form a template or create a template for the antenna pattern. The core 403 is shown after the mold 401 and 402 has formed the voids 404A and 404B and the depression troughs 406A and 406B. The core 403 may be formed in the manner described above in which an unvulcanized rubber composition is placed within the mold and compressed under high pressure and with high temperature in the manner described above to form the vulcanized core 403. The mold 401 and 402 includes protrusions 403A and 403B which form the voids 404A and 404B. Similarly, the mold 401 and 402 includes protrusions 405A and 405B which cause the formation of the troughs 406A and 406B, thereby creating a template for the formation of the antenna pattern. It will be appreciated that FIG. 10 is a cross-sectional view of the mold with the core within the mold after the core has been molded.

Figure 11A:
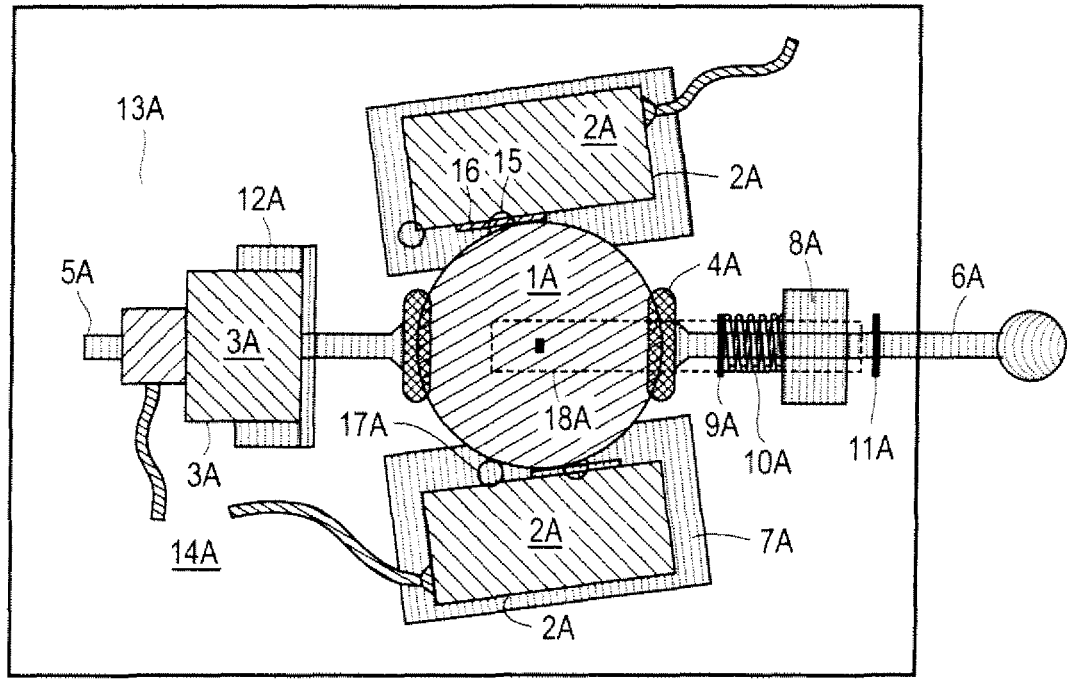
FIGS. 11A, 11B, 11C, and 11D show top, top, side and bottom views respectively of an inkjet printer for use in at least one method of making a golf ball.
Figure 11B:
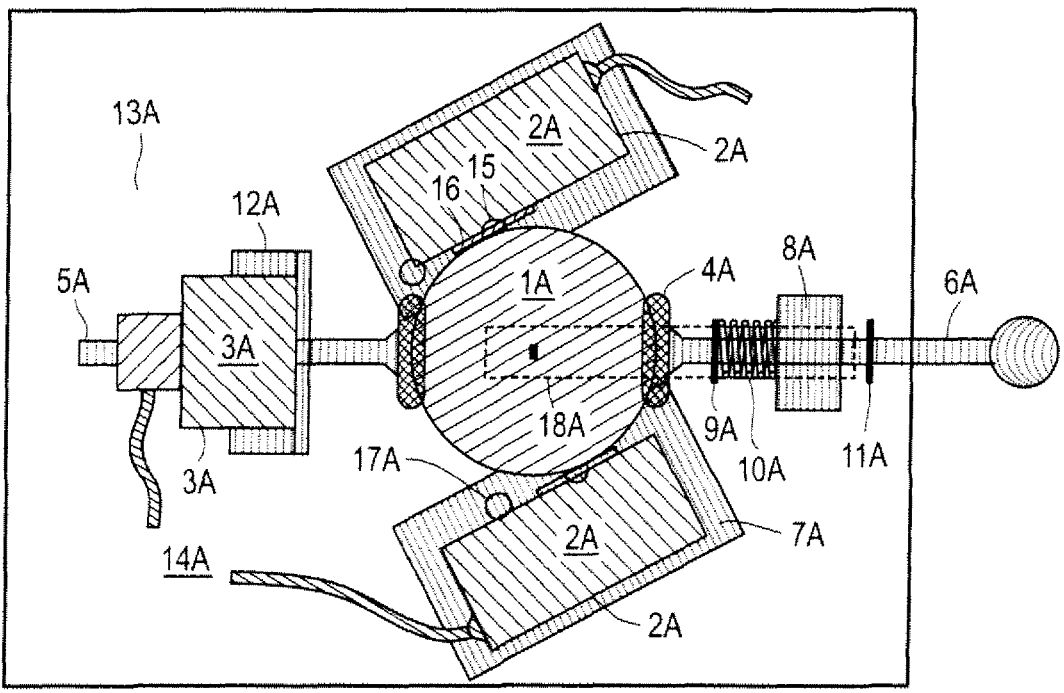
Figure 11C:
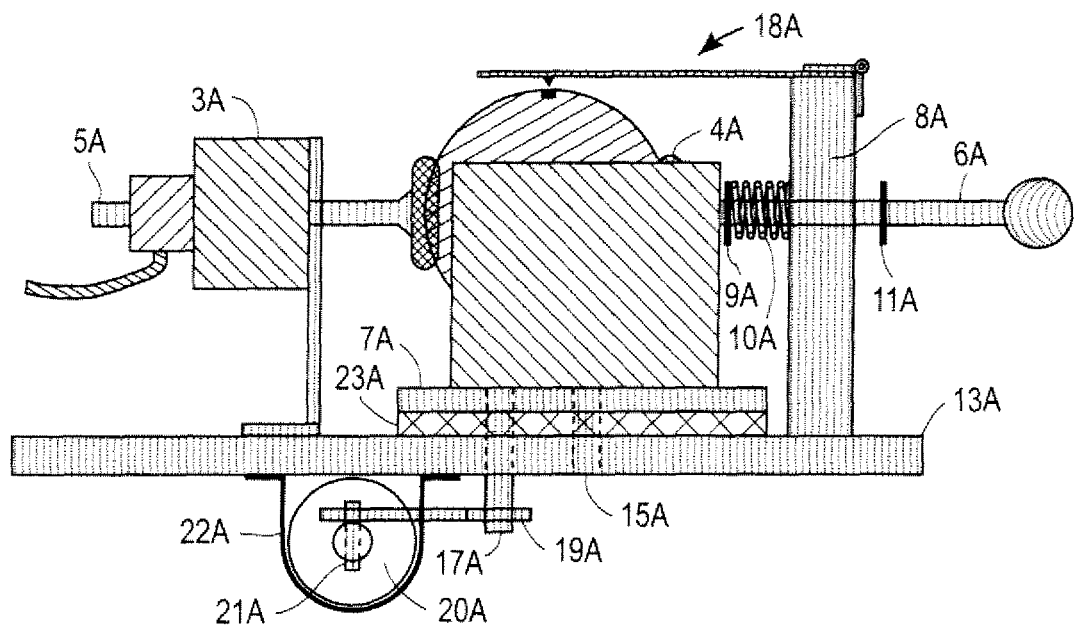
Figure 11D:
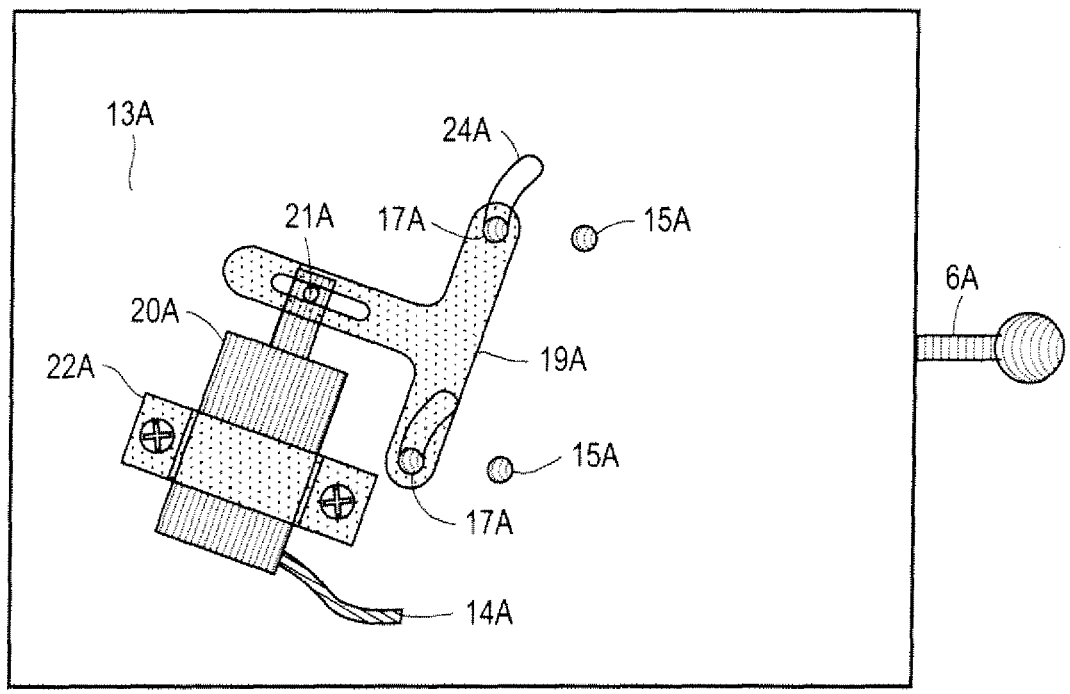

FIGS. 11A, 11B, 11C, and 11D show an example of an inkjet printer which may be used to create antenna patterns or to couple diodes to antenna patterns (or to do both) as described herein. FIGS. 11A and 11B show a top view of the printer with, in the case of FIG. 11A, the print heads in a first position and with, in the case of FIG. 11B, the print heads in a second position. FIG. 11C shows a side view of the inkjet printer, and FIG. 11D shows a bottom view. As shown in FIGS. 11A, 11B and 11C, the ball's core (or core and mantle layer) 1A is held between print heads 2A and core alignment grips 4A. A controllable rotation motor 3A (e.g. stepper motor) is used to rotate the core 1A while the print heads 2A disperse ink onto the core's surface. The core rotation control and motor shaft 5A and the core clamping and rotation shaft 6A serve to control the rotation of the core 1A. Shafts 5A and 6A are fixedly coupled to the core alignment grips 4A. The inkjet print head mounting plate 7A holds the inkjet print heads 2A and allows for movement of these heads as shown by the two different positions in FIGS. 11A and 11B. A clamping shaft control support 8A supports the position of the shaft 6A. A compression spring washer 9A, which is fixed to the shaft 6A, is pressed by the clamping shaft actuation spring 10A so that the core alignment grip 4A which is coupled to the shaft 6A is pressed against the core 1A. The stop washer 11A, which is also fixed to the shaft 6A, is used to adjust the position of the grip 4A relative to the core 1A. A motor support bracket 12A supports the motor 3A so that it is in a relatively fixed position relative to the core 1A. A base plate 13A supports the motor 12A and print heads 2A as well as the other structures shown in FIGS. 11A, 11B, 11C, and 11D. Electronic control and power cables 14A provides power and controls to the motor 12A as well as the print heads 2A. A rotation axle pin 15A, which exists for each of the two print heads 2A, supports rotation about the fixed position of the pins 15A; this can be seen from the view of FIG. 11D. The rotation of the print heads is controlled by the rotation actuation arm 19A which is coupled to rotation actuation pins 17A which extend from the mounting plates 7A of each of the two print heads 2A. This allows for movement of the inkjet emission heads 16A around the surface of the core 1A. FIGS. 11A and 11B show the movement between two positions of the print heads 2A. The print heads are rotated on their respective mounting plates 7A which are slidably attached to the surface 13A through a Teflon support block 23A for each of the mounting plates 7A. The rotation actuation pins 17A engage holes in the rotation actuation arm 19A. This arm 19A pushes the pins 17A. The arm 19A is attached to an attachment pin 21A which in turn is coupled to an actuation solenoid 20A. The actuation solenoid 20A causes motion of the attachment pin 21A which in turn moves the arm 19A to cause the print heads to move. The actuation solenoid 20A is held to the base plate 13A by the solenoid mounting bracket 22A. The solenoid 20A is also coupled to receive electronic control and power through the control cables 14A. A core alignment guide 18 is used to help align the core when initializing the system.

A method for finding a findable golf ball which includes a tag will now be described. This method may be employed by golfers in situations where the ball is not responding or the ball is only weakly responding to excitation signals from a transmitting/receiving unit. This may occur when the orientation of the ball and its tag is such that the re-radiated signal is weak or virtually nonexistent. This method may be employed in the case of golf balls having a single tag (such as the golf balls shown in FIGS. 4A and 4B and 4C), and this method may also be employed in the case of golf balls which have more than one tag, where one of those tags may have failed. A golfer may hold the transmitting/receiving device in a first orientation such that the device is transmitting radiofrequency signals and receiving re-radiated radiofrequency signals in a first orientation. The golfer may then decide to change the orientation of the transmitting/receiving device to a second orientation which is at a non-zero angle relative to the first orientation. This will tend to cause better reception in the case of tags which are not properly oriented relative to the first orientation. Thus a golfer may decide to rotate a handheld transmitting/receiving device from 0° to 90° or from 0° to 270° in order to try to obtain better reception of a re-radiated signal from a golf ball. The non-zero angle will typically be between about 45° to 135° from a first orientation which may be considered to be at 0°. The golfer may employ this technique in the case of a golf ball having multiple tags or if one of the tags fails. Other uses of this method include using this technique for golf balls which only have one tag or one tag and a dummy tag as described above.

It will be appreciated that numerous modifications of the various embodiments described herein may be made. For example, each golf ball could be printed with a unique identification number such as a serial number in order to allow a user to identify from a group of lost balls which lost ball is his/her lost ball. Alternatively, a quasi-unique identifier, such as a manufacturing date when the ball is manufactured, may be printed on the outside of the ball so it can be read by a user to verify that a user's ball has been found within a group of lost balls which have been uncovered by the handheld transmitting/receiving device. Alternatively, the user may apply an identifier such as the user's initials onto the ball to thereby identify the ball when it has been uncovered by a handheld transmitting/receiving device. It will also be appreciated that the tags discussed above are passive tags having no active integrated circuit components such as semiconductor memory circuits, and the antenna does not need to energize such active integrated circuit components such as semiconductor memory components. However, in certain alternative embodiments, tags, such as RFID integrated circuit (IC) tags which include an electronic identification number (IDN) stored within the IC, may be used in the various different findable golf balls described herein. These tags would be "read" by a transmitting/receiving (T/R) device which transmits the IDN and "listens" for a reply from the tag with the IDN. In this case a user would program the IDN of a golf ball into the T/R device which can then be used to find the ball. The entire circuitry of such an RFID IC (with an IC) may be fit into 1 package (e.g. one of the packages shown in FIGS. 7A-7C) and coupled to an antenna, such as one of the antennas shown in FIGS. 8A-8G. Such an RFID (with IDN) may be used in a ball without a longer range tag (such as a harmonic tag which may be implemented as shown in FIGS. 2A, 2B, and 3A) in the same ball, or such an RFID (with IDN) may be used in a ball with a longer range tag (e.g. as implemented in FIGS. 2A, 2B and 3A) in the same ball as the RFID (with IDN).

While various embodiments described herein relate to golf balls, alternative embodiments may be used in other types of balls (e.g. baseballs).

The various embodiments of golf balls described herein may work with a handheld transmitting/receiving device which transmits electromagnetic energy at a first frequency and receives re-radiated energy at a second frequency. Examples of such transmitting/receiving devices are described in co-pending U.S. application Ser. No. 10/346,919, filed on Jan. 17, 2003 by inventors Chris Savarese, et al., which application is hereby incorporated by reference at least for the purpose of describing such transmitting/receiving devices.

In the foregoing specification, the invention has been described with reference to specific examples. It will be evident that various modifications may be made thereto without departing from the broader spirit and scope specified by the following claims. The specification and drawings are, accordingly, to be regarded in an illustrative sense rather than a restrictive sense.

What is claimed is:

1. A method of making a golf ball, said method comprising:
   forming a first member having an outer surface, said first member forming a part of said golf ball, and forming said first member comprising forming a shape in said outer surface to define a template on said outer surface;
   depositing a liquid material onto said outer surface of the first member in a pattern defined by the template, wherein the liquid material when dried forms at least one antenna which is electrically conductive; and
   forming a second member which surrounds said at least one antenna.

2. The method as in claim 1, further comprising:
   curing said liquid material; and
   coupling a diode to said at least one antenna.

3. The method as in claim 1, wherein said at least one antenna is an elastic conductive material.

4. The method as in claim 3, wherein said depositing comprises at least one of (a) painting said liquid material; (b) printing said liquid material; (c) jetting said liquid material through a nozzle; and (d) spraying said liquid material.

5. The method as in claim 1, wherein said first member is a core material of said golf ball, said core material having a substantially spherical shape, and said second member is a layer of material which has a circular cross-sectional shape and which encases said first member and said at least one antenna.

6. The method as in claim 5, wherein said second member is an outermost shell of said golf ball.

7. The method as in claim 5, wherein said second member is an inner shell.

8. The method as in claim 3, wherein said elastic conductive material is a conductive ink.

9. The method as in claim 1, wherein
   forming said shape in said outer surface comprises forming one or more grooves extending into said first member.

10. The method as in claim 1, further comprising:
    forming a void in said outer surface;
    depositing at least a portion of a diode in said void; and
    coupling said diode to said at least one antenna.

11. The method as in claim 1, wherein said at least one antenna is patterned as a radial transmission line.

12. The method as in claim 1, wherein said at least one antenna has at least one perforation which extends from a first surface of said at least one antenna to a second surface of said at least one antenna.

13. The method as in claim 1, wherein said at least one antenna comprises an inductive element.

14. The method as in claim 1, wherein said liquid material comprises a solvent, a polymer and metal particles dispersed in said polymer.

15. The method as in claim 1, wherein said at least one antenna is part of a radio frequency tag which can be used to find said golf ball and wherein said golf ball has high durability.

16. A method of making a golf ball, said method comprising:
    forming a first member having an outer surface;
    forming independent tags comprising respective antennas on said outer surface, said outer surface forming at least a portion of a sphere's surface, and said independent tags being arranged in a substantially orthogonal manner relative to each other; and
    forming a second member which surrounds said independent tags.

17. The method as in claim 16, wherein said independent tags comprise three independent tags.

18. The method as in claim 16, wherein each of said independent tags comprises a radio frequency identification (RFID) integrated circuit.

19. The method as in claim 16, wherein said antennas are formed from a liquid material which is dried.

20. A method for making a golf ball, said method comprising:
    forming a first member having an outer surface;
    forming an elastic antenna on a substrate;
    coupling a diode to said elastic antenna on said substrate;
    transferring said elastic antenna and said diode on said substrate to said outer surface of the first member; and
    forming a second member which surrounds said elastic antenna and said diode.

* * * * *